United States Patent
Hatanaka

(10) Patent No.: US 8,168,371 B2
(45) Date of Patent: May 1, 2012

(54) POSITIVE PHOTOSENSITIVE RESIN COMPOSITION

(75) Inventor: Tadashi Hatanaka, Toyama (JP)

(73) Assignee: Nissan Chemical Industries, Ltd., Tokyo (JP)

( * ) Notice: Subject to any disclaimer, the term of this patent is extended or adjusted under 35 U.S.C. 154(b) by 469 days.

(21) Appl. No.: 12/449,022

(22) PCT Filed: Jan. 18, 2008

(86) PCT No.: PCT/JP2008/050644
§ 371 (c)(1),
(2), (4) Date: Jul. 21, 2009

(87) PCT Pub. No.: WO2008/090827
PCT Pub. Date: Jul. 31, 2008

(65) Prior Publication Data
US 2010/0028805 A1    Feb. 4, 2010

(30) Foreign Application Priority Data

Jan. 22, 2007   (JP) .................................. 2007-011414

(51) Int. Cl.
*G03F 7/039* (2006.01)
*G03F 7/004* (2006.01)

(52) U.S. Cl. ............... 430/288.1; 430/270.1; 430/281.1; 430/326; 430/18

(58) Field of Classification Search .................. None
See application file for complete search history.

(56) References Cited

U.S. PATENT DOCUMENTS

| | | | |
|---|---|---|---|
| 5,075,199 A | 12/1991 | Schwalm et al. | |
| 5,882,844 A | 3/1999 | Tsuchiya et al. | |
| 6,245,485 B1 | 6/2001 | Aoai et al. | |
| 7,001,705 B2 | 2/2006 | Hatanaka et al. | |
| 2001/0036591 A1 | 11/2001 | Schulz et al. | |
| 2006/0211797 A1 | 9/2006 | Tsuji et al. | |
| 2007/0020559 A1 | 1/2007 | Hatanaka | |
| 2008/0044764 A1 | 2/2008 | Takahashi et al. | |

FOREIGN PATENT DOCUMENTS

| | | |
|---|---|---|
| JP | A-4-211255 | 8/1992 |
| JP | A-9-274319 | 10/1997 |
| JP | A-10-197715 | 7/1998 |
| JP | A-10-206627 | 8/1998 |
| JP | A-11-54270 | 2/1999 |
| JP | A-11-326625 | 11/1999 |
| JP | A-2000-187111 | 7/2000 |
| JP | A-2000-353594 | 12/2000 |
| JP | A-2001-27804 | 1/2001 |
| JP | A-2005-134440 | 5/2005 |
| JP | A-2005-181976 | 7/2005 |
| JP | A-2005-300759 | 10/2005 |
| WO | WO 2005/052688 A2 | 6/2005 |
| WO | WO 2005/116764 A1 | 12/2005 |
| WO | WO 2007/086249 A1 | 8/2007 |
| WO | WO 2007/132890 A1 | 11/2007 |
| WO | WO 2007/132892 A1 | 11/2007 |
| WO | WO 2007/145249 A1 | 12/2007 |
| WO | WO 2008/029706 A1 | 3/2008 |
| WO | WO 2008/035672 A1 | 3/2008 |

OTHER PUBLICATIONS

Feb. 15, 2012 Office Action issued in U.S. Appl. No. 11/491,156.

*Primary Examiner* — Cynthia Hamilton
(74) *Attorney, Agent, or Firm* — Oliff & Berridge, PLC

(57) ABSTRACT

It is an object of the present invention to provide a positive photosensitive resin composition capable of easily forming an image having high water repellency and high oil repellency on a surface of a cured film thereof even after a treatment with oxygen plasma or the like, and also having an insulating property with high precision and high throughput; and a cured film suitable for a film material of various displays obtained using the positive photosensitive resin composition.

12 Claims, 1 Drawing Sheet

POSITIVE PHOTOSENSITIVE RESIN COMPOSITION

TECHNICAL FIELD

The present invention relates to a positive photosensitive resin composition and a cured film obtained from the composition. More particularly, the invention relates to a positive photosensitive resin composition capable of forming an image having high water repellency and high oil repellency on the surface of a cured film thereof, a cured film of the composition, and various materials using the cured film. The positive photosensitive resin composition is particularly suitable to be used as an interlayer insulating film of liquid crystal displays or electroluminescent (EL) displays, and as a light shielding material or a barrier rib material corresponding to an inkjet method.

BACKGROUND ART

Typically, for display devices such as thin film transistor (TFT) liquid crystal display devices and organic electroluminescent (EL) devices, a patterned electrode protecting film, a flattening film, an insulating film, or the like is provided. Among photosensitive resin compositions, a photosensitive resin composition characterized by having small numbers of processes to obtain a pattern shape required and further by having adequate flatness has been widely used as a material forming these films.

In addition, a technology of manufacturing a substrate for a full-color display using inkjet during a process of manufacturing a display device is also studied actively in these years. For example, as for manufacture of a color filter for a liquid crystal display device, a related-art printing method, electrodeposition method, staining method, or pigment dispersion method has been used. On the other hand, a color filter in which a compartment (hereinafter referred to as a bank) that defines a previously patterned pixel is formed with a photosensitive resin layer that shields light, and in which an ink droplet is put in an opening part surrounded by the bank, a manufacturing method of the color filter (for example, see Patent Document 1, Patent Document 2, and Patent Document 3), and the like have been proposed. In addition, for an organic EL display device, a manufacturing method of the organic EL display device by manufacturing the bank in advance, and putting a droplet of ink that becomes an emission layer in a similar manner (for example, see Patent Document 4) has been proposed.

However, when an ink droplet is put in an opening surrounded by the bank by an inkjet method, in order to prevent a matter that the ink droplet overflows into a neighbor pixel over the bank, a substrate is required to have ink affinity property (hydrophilicity), and the surface of the bank is required to have water repellency.

In order to achieve the above objects, it has been proposed to afford hydrophilicity to the substrate and to afford water repellency to the bank by a continuous plasma (ozone) treatment such as an oxygen gas plasma treatment and a fluorine gas plasma treatment (for example, see Patent Document 5). However, the process is complicated and troublesome. In addition, it has been proposed to mix a fluorochemical surfactant and a fluorine polymer in a photosensitive organic thin film (for example, see Patent Document 6). However, there are many things to be considered including not only photosensitivity but also film-forming performance such as compatibility and an additive amount, which makes the method hardly practical.

Then, the above described films require, besides water repellency, characteristics such as: being excellent in process resistance such as a low dielectric constant property, heat resistance, and solvent resistance; having favorable adhesiveness with a foundation; having a wide process margin capable of forming a pattern under various process conditions in accordance with the intended use; and moreover, having high sensitivity and high transparency as well as having reduced film unevenness after development. Consequently, from a point of view of the required characteristics, a resin containing naphthoquinone diazide compounds has been used conventionally as the photosensitive resin composition.

Meanwhile, one of the particularly important characteristics among the required characteristics of such a photosensitive resin material is sensitivity. In the industrial production of display devices or the like, the improvement of sensitivity allows to cut time required for production remarkably. Therefore, under present circumstances where demand of liquid crystal displays is significantly increased, sensitivity is one of the most important characteristics required for this type of photosensitive resin material.

Therefore, several developments have been previously performed to achieve high sensitivity of the photosensitive resin material. For example, a radiation-sensitive resin composition containing an alkali soluble resin and at least any of a particular polyhydroxy compound and a derivative thereof has been proposed (for example, see Patent Document 7).

On the other hand, a chemically amplified resist has been developed as a photosensitive material having high sensitivity and a high resolution. A related-art chemically amplified resist that has been developed as a resist for semiconductors can also be applied to a light source (KrF, ArF) having a shorter wavelength than an i-line, and can form a finer pattern. However, under a high temperature such as a temperature used for curing a film, or under the presence of a resist stripper, the bond part of a protecting group or the thermal crosslinking part of an ether bond is easily decomposed. Therefore, due to a significantly low heat resistance and chemical resistance, it is almost impossible to use the related-art chemically amplified resist as a permanent film (for example, see Patent Document 8). In addition, a crosslinking type of epoxies or aminoplasts being introduced into the chemically amplified resist to enable thermal curing causes such problems that crosslinkage at an exposed part is progressed to lose a dissolution contrast with an unexposed part, due to the influence of an acid generated from a photoacid generator (PAG) in the resist by exposure. Therefore, it is difficult to introduce such a crosslinking type into the chemically amplified resist.

[Patent Document 1]
Japanese Patent Application Publication No. JP-A-10-206627
[Patent Document 2]
Japanese Patent Application Publication No. JP-A-11-326625
[Patent Document 3]
Japanese Patent Application Publication No. JP-A-2000-187111
[Patent Document 4]
Japanese Patent Application Publication No. JP-A-11-54270
[Patent Document 5]
Japanese Patent Application Publication No. JP-A-2000-353594
[Patent Document 6]
Japanese Patent Application Publication No. JP-A-10-197715

[Patent Document 7]
Japanese Patent Application Publication No. JP-A-4-211255
[Patent Document 8]
U.S. Pat. No. 5,075,199

DISCLOSURE OF THE INVENTION

Problems to be Solved by the Invention

In order to solve the problems described above, it is an object of the present invention to provide a photosensitive resin composition suitable for a material to form a patterned insulating film used for a liquid crystal display device, an organic EL display device, or the like, and as a barrier rib material between pixels. Specifically, such a photosensitive resin composition can easily form an image having high water repellency and high oil repellency on the surface of a cured film thereof even after a treatment with oxygen plasma or the like, and also having an insulating property with high precision and high throughput.

In addition, it is another object of the present invention to provide a cured film that can be obtained by using such a positive photosensitive resin composition and that can prevent a matter that an ink droplet overflows into a neighbor pixel over a bank during the manufacture of a substrate using inkjet, and to provide various devices and materials that are formed using such a cured film.

Means for Solving the Problems

As a result of assiduous research intended to overcome these disadvantages, the present inventors completed the present invention.

That is, according to a first aspect, a positive photosensitive resin composition contains: a component (A), a component (B), a component (C), a component (D), and a solvent (E), in which the component (A): is an alkali soluble resin having a functional group capable of carrying out a thermal crosslinking reaction with a compound of the component (B), a functional group for curing a film, capable of carrying out a thermal curing reaction with a compound of the component (C), an organic group having a fluoroalkyl group, and an organic group containing a silicon atom, and having a number average molecular weight of 2,000 to 30,000;

the component (B): is a compound having two or more vinyl ether groups in one molecule thereof;

the component (C): is a compound having two or more blocked isocyanate groups in one molecule thereof;

the component (D): is a photoacid generator; and the solvent (E).

According to a second aspect, in the positive photosensitive resin composition according to the first aspect, the functional group capable of carrying out a thermal crosslinking reaction is at least one type selected from a group consisting of a carboxyl group and a phenolic hydroxy group, and the functional group for curing a film is at least one type selected from a group consisting of a hydroxy group other than a phenolic hydroxy group and an amino group having active hydrogen.

According to a third aspect, in the positive photosensitive resin composition according to the first aspect or the second aspect, the organic group having a fluoroalkyl group has a structure shown in Formula (1):

[Chemical Formula 1]

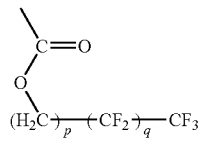

(where p represents an integer of 0 to 5; q represents an integer of 0 to 11).

According to a fourth aspect, in the positive photosensitive resin composition according to any one of the first aspect to the third aspect, the organic group containing a silicon atom has a structure shown in Formula (2):

[Chemical Formula 2]

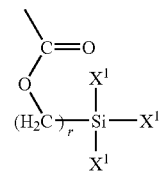

(where $X^1$ represents a methyl group, an ethyl group, a trimethoxysiloxy group, or a triethoxysiloxy group; r represents an integer of 0 to 5).

According to a fifth aspect, in the positive photosensitive resin composition according to any one of the first aspect to the fourth aspect, 1 to 80 parts by mass of the component (B), 1 to 80 parts by mass of the component (C), and 0.5 to 80 parts by mass of the component (D) are contained based on 100 parts by mass of the component (A).

According to a sixth aspect, the positive photosensitive resin composition according to any one of the first aspect to the fifth aspect further contains: an alkali soluble resin other than the component (A) as a component (F), in which 1 to 900 parts by mass of the alkali soluble resin other than the component (A) is contained based on 100 parts by mass of the component (A).

According to a seventh aspect, the positive photosensitive resin composition according to the fifth aspect or the sixth aspect further contains: a siloxane compound as a component (G), in which 0.1 to 30 parts by mass of the siloxane compound is contained based on 100 parts by mass of the component (A).

According to an eighth aspect, a cured film made of the positive photosensitive resin composition as described in any one of the first aspects to the seventh aspect.

According to a ninth aspect, a barrier rib material for an organic electroluminescent (EL) display device includes: the cured film as described in the eighth aspect.

According to a tenth aspect, a liquid crystal display device includes: the cured film as described in the eighth aspect.

According to an eleventh aspect, an array flattening film for a liquid crystal display includes: the cured film as described in the eighth aspect.

According to a twelfth aspect, an interlayer insulating film includes: the cured film as described in the eighth aspect.

Effects of the Invention

The positive photosensitive resin composition of the present invention is suitable for a material to form a patterned insulating film used for a liquid crystal display device, an organic EL display device, or the like, and as a barrier rib material between pixels. Further, the photosensitive resin composition can easily form a pattern having high water repellency and high oil repellency on the surface of the pattern, in which the water repellency and the oil repellency are not considerably lowered even after an oxygen plasma treatment (an ozone treatment), and having an insulating property, with high precision and high throughput.

In addition, the cured film made of the positive photosensitive resin composition of the present invention can prevent a matter that an ink droplet overflows into a neighbor pixel over a bank during the manufacture of a substrate using inkjet. Further, a variety of devices and materials that are formed using such a cured film can be provided.

BEST MODES FOR CARRYING OUT THE INVENTION

A positive photosensitive resin composition of the present invention is a composition containing an alkali soluble resin of a component (A), a compound having vinyl ether groups of a component (B), a compound having blocked isocyanate groups of a component (C), a photoacid generator of a component (D), and a solvent (E), and optionally, containing another alkali soluble resin of a component (F), and further a siloxane compound of a component (G) described below, an amine compound of a component (H), or a surfactant of a component (I). The details of each component will be described.

(Component (A))

The component (A) is an alkali soluble resin having, in the structure of the resin, a functional group capable of carrying out a thermal crosslinking reaction with the compound of the component (B); a functional group for curing a film, capable of carrying out a thermal curing reaction with the compound of the component (C); an organic group having a fluoroalkyl group; and an organic group containing a silicon atom, and having a number average molecular weight as converted into polystyrene (hereinafter, referred to as a number average molecular weight) of 2,000 to 30,000.

The functional group for a thermal crosslinking reaction is a group capable of forming a resist film by reacting with vinyl ether groups in the compound of the component (B) under an enhanced temperature to be thermally crosslinked with the compound of the component (B). The typical functional group thereof is at least one type selected from a group consisting of a carboxyl group and a phenolic hydroxy group.

The functional group for curing a film is a group capable of curing a film by carrying out a crosslinking reaction between the thermal crosslinking body formed from the component (A) and the component (B) (at an exposed part, a decrosslinking body in which a thermal crosslinking body is further dissociated), and the compound of the component (C) via an isocyanate group from which a block part is dissociated under a further enhanced temperature. The typical functional group thereof is at least one type selected from a group consisting of a hydroxy group other than a phenolic hydroxy group and an amino group having active hydrogen. Here, the amino group having active hydrogen means a primary or secondary amino group that can release hydrogen by a reaction. Accordingly, since an amide group has no active hydrogen, an amide group does not fall under the definition of the amino group having active hydrogen.

The organic group having a fluoroalkyl group is a group having a function to improve water repellency and oil repellency of the surface of a cured film. In the present invention, the organic group is not particularly limited so long as it is an organic group having a fluoroalkyl group. However, among such groups, an organic group having a structure represented by Formula (1) is preferred, because the group is easy to impart favorable water repellency and oil repellency to the surface of a cured film.

[Chemical Formula 3]

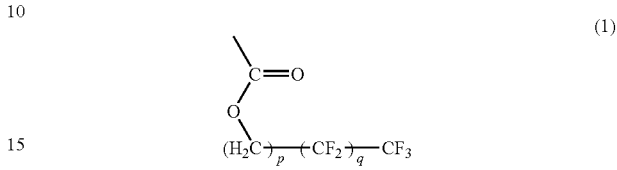

(where p represents an integer of 0 to 5; q represents an integer of 0 to 11).

The organic group containing silicon has a function to improve water repellency of the surface of a cured film and further has a function to impart high water repellency and oil repellency to the surface of the cured film of the present invention even after the cured film is treated by an oxygen plasma treatment, an ultraviolet (UV)-ozone treatment, or the like (hereinafter also referred to as UV ozone resistance). According to the present invention, the organic group is not particularly limited so long as it is an organic group containing a silicon atom. However, among such groups, an organic group having a structure represented by Formula (2) is preferred, because the group is easy to impart favorable water repellency and oil repellency to the surface of a cured film.

[Chemical Formula 4]

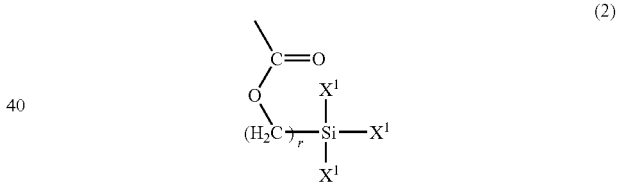

(where $X^1$ represents a methyl group, an ethyl group, a trimethoxysiloxy group, or a triethoxysiloxy group; r represents an integer of 0 to 5).

In the present invention, the surface of a cured film has high water repellency and oil repellency even after the cured film is treated by an oxygen plasma treatment, a UV-ozone treatment, or the like. This effect is achieved by both the organic group having a fluoroalkyl group and the organic group containing a silicon atom that are present as side chains.

In addition, when a structure containing a silicon atom, e.g., a siloxy group, is introduced to a main chain, the silicon atom does not contribute to providing water repellency and oil repellency to the surface of a cured film. Meanwhile, also when the structure is introduced to the end of a main chain, adequate water repellency and oil repellency are not obtained.

While the resin of the component (A) is an alkali soluble resin having such a structure, a bone structure of a main chain of a polymer constituting the resin, the type of a side chain, and the like are not particularly limited.

However, the number average molecular weight of the resin of the component (A) is within the range of 2,000 to 30,000. When the number average molecular weight is over 30,000 to be excessive, a development residue is prone to occur and sensitivity is reduced considerably. On the other hand, when the number average molecular weight is less than 2,000 to be too low, since a considerable amount of a film thickness loss at an unexposed part occurs during development, shortage of curing may be caused.

Examples of the alkali soluble resin of the component (A) include an acrylic resin and a polyhydroxystyrene resin. In particular, an acrylic resin is more preferred because of its high transparency.

In addition, in the present invention, an alkali soluble resin made of a copolymer obtained by polymerizing a plurality of types of monomers (hereinafter, referred to as a specific copolymer) may be used as the component (A). In this case, the alkali soluble resin of the component (A) may be a plurality of types of specific copolymers blended.

In other words, the specific copolymer is a copolymer formed from: a monomer having a functional group for a thermal crosslinking reaction, that is, at least one type of monomers accordingly selected from a group consisting of a monomer having at least one of a carboxyl group and a phenolic hydroxy group; a monomer having a functional group for curing a film, that is, at least one type of monomers accordingly selected from a group consisting of a monomer having at least one of a hydroxy group other than a phenolic hydroxy group and an amino group having active hydrogen; at least one type of monomers accordingly selected from a group consisting of a monomer having an organic group having a fluoroalkyl group; and at least one type of monomers accordingly selected from a group consisting of a monomer having an organic group containing a silicon atom, as an essential structural unit. In addition, the specific copolymer has a number average molecular weight of 2,000 to 30,000.

The "monomer having at least one of a carboxyl group and a phenolic hydroxy group" includes: a monomer having a carboxyl group; a monomer having a phenolic hydroxy group; and a monomer having both a carboxyl group and a phenolic hydroxy group. These monomers are not limited to having one carboxyl group or one phenolic hydroxy group, and may have a plurality of the groups.

The "monomer having at least one of a hydroxy group other than a phenolic hydroxy group and an amino group having active hydrogen" includes: a monomer having a hydroxy group other than a phenolic hydroxy group; a monomer having an amino group having active hydrogen; and a monomer having both a hydroxy group other than a phenolic hydroxy group and an amino group having active hydrogen. These monomers are not limited to having one hydroxy group other than a phenolic hydroxy group or one amino group having active hydrogen, and may have a plurality of the groups.

The above monomers will be specifically exemplified below, however they are not limited thereto.

Examples of the monomer having a carboxyl group include an acrylic acid, a methacrylic acid, a crotonic acid, mono-(2-(acryloyloxy)ethyl)phthalate, mono-(2-(methacryloyloxy)ethyl)phthalate, N-(carboxyphenyl)maleimide, N-(carboxyphenyl)methacrylamide, and N-(carboxyphenyl)acrylamide.

Examples of the monomer having a phenolic hydroxy group include hydroxystyrene, N-(hydroxyphenyl)acrylamide, N-(hydroxyphenyl)methacrylamide, and N-(hydroxyphenyl)maleimide.

Examples of the monomer having a hydroxy group other than a phenolic hydroxy group include 2-hydroxyethyl acrylate, 2-hydroxypropyl acrylate, 5-acryloyloxy-6-hydroxynorbornene-2-carboxylic-6-lactone, 2-hydroxyethyl methacrylate, 2-hydroxypropyl methacrylate, and 5-methacryloyloxy-6-hydroxynorbornene-2-carboxylic-6-lactone.

Examples of the monomer having an amino group having active hydrogen include 2-aminoethyl acrylate and 2-aminomethyl methacrylate.

Examples of the monomer having an organic group having a fluoroalkyl group include pentafluoropropyl acrylate, heptafluorobutyl acrylate, pentadecafluorooctyl acrylate, heptadecafluorodecyl acrylate, 2-(nonafluorobutyl)ethyl acrylate, 2-(perfluorodecyl)ethyl acrylate, 2-(perfluorohexyl)ethyl acrylate, trifluoroethyl acrylate, pentafluoropropyl methacrylate, heptafluorobutyl methacrylate, pentadecafluorooctyl methacrylate, heptadecafluorodecyl methacrylate, 2-(nonafluorobutyl)ethyl methacrylate, 2-(perfluorooctyl)ethyl methacrylate, 2-(perfluorodecyl)ethyl methacrylate, 2-(perfluorohexyl)ethyl methacrylate, and trifluoroethyl methacrylate.

Examples of the monomer having an organic group containing a silicon atom include methacryloxypropyltris(trimethylsiloxy)silane, methacryloxypropylpentamethyldisiloxane, trimethylsiloxyethyl methacrylate, trimethylsilylmethyl methacrylate, (methacryloxymethyl)phenyldimethylsilane, (3-methacryloxypropyl)methylbis(trimethylsiloxy)silane, methacryloxymethyltris(trimethylsiloxy)silane, methacryloxypropyltris(pentamethyldisiloxy)silane, acryloxypropyltris(trimethylsiloxy)silane, acryloxypropylpentamethyldisiloxane, trimethylsiloxyethyl acrylate, trimethylsilylmethyl acrylate, (acryloxymethyl)phenyldimethylsilane, (3-acryloxypropyl)methylbis(trimethylsiloxy)silane, acryloxymethyltris(trimethylsiloxy)silane, and acryloxypropyltris(pentamethyldisiloxy)silane.

The specific copolymer may be a copolymer formed from a monomer other than: a monomer having a functional group for a thermal crosslinking reaction; a monomer having a functional group for curing a film; a monomer having an organic group having a fluoroalkyl group; and a monomer having an organic group containing a silicon atom (hereinafter, referred to as an other monomer), as a structural unit.

Specifically, the other monomer may be a monomer capable of copolymerizing with: a monomer having at least one of a carboxyl group and a phenolic hydroxy group; a monomer having at least one of a hydroxy group other than a phenolic hydroxy group and an amino group having active hydrogen; a monomer having an organic group having a fluoroalkyl group; and a monomer having an organic group containing a silicon atom. The other monomer is not particularly limited unless it undermines the characteristics of the component (A).

Specific examples of the other monomer include an acrylic acid ester compound, a methacrylic acid ester compound, a maleimide compound, acrylonitrile, maleic acid anhydride, a styrene compound, and a vinyl compound.

Examples of the acrylic acid ester compound include methyl acrylate, ethyl acrylate, isopropyl acrylate, benzyl acrylate, naphthyl acrylate, anthryl acrylate, anthrylmethyl acrylate, phenyl acrylate, 2,2,2-trifluoroethyl acrylate, tert-butyl acrylate, cyclohexyl acrylate, isobornyl acrylate, 2-methoxyethyl acrylate, methoxytriethyleneglycol acrylate, 2-ethoxyethyl acrylate, tetrahydrofurfuryl acrylate, 3-methoxybutyl acrylate, 2-methyl-2-adamantyl acrylate, 2-propyl-2-adamantyl acrylate, 8-methyl-8-tricyclodecyl acrylate, and 8-ethyl-8-tricyclodecyl acrylate.

Examples of the methacrylic acid ester compound include methyl methacrylate, ethyl methacrylate, isopropyl methacrylate, benzyl methacrylate, naphthyl methacrylate, anthryl methacrylate, anthrylmethyl methacrylate, phenyl methacrylate, 2,2,2-trifluoroethyl methacrylate, tert-butyl methacrylate, cyclohexyl methacrylate, isobornyl methacrylate, 2-methoxyethyl methacrylate, methoxytriethyleneglycol methacrylate, 2-ethoxyethyl methacrylate, tetrahydrofurfuryl methacrylate, 3-methoxybutyl methacrylate, 2-methyl-2-adamantyl methacrylate, 2-propyl-2-adamantyl methacrylate, 8-methyl-8-tricyclodecyl methacrylate, and 8-ethyl-8-tricyclodecyl methacrylate.

Examples of the vinyl compound include vinylbiphenyl, vinylphthalimide, vinylanthracene, vinylnaphthalene, and vinylbenzoic acid.

Examples of the styrene compound include styrene, methylstyrene, chlorostyrene, and bromostyrene.

Examples of the maleimide compound include maleimide, N-methylmaleimide, N-phenylmaleimide, and N-cyclohexylmaleimide.

A method for obtaining the specific copolymer used in the present invention is not particularly limited. However, the specific copolymer is obtained by carrying out a polymerization reaction of: at least one type of monomers accordingly selected from a group consisting of a monomer having at least one of a carboxyl group and a phenolic hydroxy group; at least one type of monomers accordingly selected from a group consisting of a monomer having at least one of a hydroxy group other than a phenolic hydroxy group and an amino group having active hydrogen; at least one type of monomers accordingly selected from a group consisting of a monomer having an organic group having a fluoroalkyl group; at least one type of monomers accordingly selected from a group consisting of a monomer having an organic group containing a silicon atom; optionally a monomer other than the above monomers; and optionally a polymerization initiator or the like, in a solvent at a temperature of 50 to 110° C. At this time, the solvent used is not particularly limited so long as the solvent dissolves a monomer constituting the specific copolymer and the specific copolymer. Specific examples of the solvent include solvents described in the solvent (E) described below.

At least one type of the monomers accordingly selected from a group consisting of a monomer having at least one of a carboxyl group and a phenolic hydroxy group, is preferably 1 to 40 parts by mass, more preferably 3 to 30 parts by mass, and particularly preferably 5 to 20 parts by mass among all of the monomer components (a total amount of 100 parts by mass). When an organic group having a carboxyl group or a phenolic hydroxy group is significantly less than 1 part by mass, sufficient developability cannot be obtained, which may reduce sensitivity and generate a residue. When the organic group is significantly more than 40 parts by mass, an unexposed part may be dissolved and adequate water repellency and oil repellency may not be obtained.

At least one type of the monomers accordingly selected from a group consisting of a monomer having at least one of a hydroxy group other than a phenolic hydroxy group and an amino group having active hydrogen, is preferably 5 to 60 parts by mass, more preferably 8 to 50 parts by mass, and particularly preferably 10 to 40 parts by mass among all of the monomer components (a total amount of 100 parts by mass). When an organic group having a carboxyl group or a phenolic hydroxy group is significantly less than 5 parts by mass, since thermal curing is inadequate, a solvent resistance may be insufficient. When the organic group is significantly more than 60 parts by mass, water repellency and oil repellency may be lowered.

The monomer having an organic group having a fluoroalkyl group is preferably 1 to 60 parts by mass, more preferably 3 to 50 parts by mass, and particularly preferably 5 to 40 parts by mass among all of the monomer components (a total amount of 100 parts by mass). When an organic group having a fluoroalkyl group is significantly less than 1 part by mass, adequate water repellency and oil repellency may not be obtained. When the organic group is significantly more than 60 parts by mass, since the component in a solution state bubbles, handling ease may be lowered.

The monomer having an organic group containing a silicon atom is preferably 10 to 80 parts by mass, more preferably 20 to 70 parts by mass, and particularly preferably 30 to 60 parts by mass among all of the monomer components (a total amount of 100 parts by mass). When an organic group containing a silicon atom is significantly less than 10 parts by mass, adequate water repellency and UV ozone resistance may not be obtained. When the organic group is significantly more than 80 parts by mass, defective development may be caused.

The thus obtained specific copolymer is generally in a solution state in which the specific copolymer is dissolved in a solvent.

In addition, the powder of the specific copolymer can be obtained by: charging the solution of the specific copolymer thus obtained to diethyl ether, water, or the like under agitation to be reprecipitated; filtering and washing the generated precipitate; and then drying at room temperature or by heating under normal pressure or reduced pressure. By such an operation, a polymerization initiator and unreacted monomers coexisting with the specific copolymer can be removed. As a result, powder of a purified specific copolymer can be obtained. When the specific copolymer cannot be purified sufficiently by a single operation, the above operation may be repeated by redissolving the obtained powder into a solvent.

In the present invention, the powder of the specific copolymer may be used as is, or the powder may be used, for example, in a solution state by redissolving the powder into the solvent (E) described below.

(Component (B))

The component (B) is a compound having two or more vinyl ether groups in one molecule thereof. While the compound has two or more vinyl ether groups that can be thermally crosslinked with the alkali soluble resin of the component (A), in one molecule thereof at a prebaking temperature in common use (for example, 80° C. to 150° C.), the type and the structure of the compound are not particularly limited.

After the compound of the component (B) is thermally crosslinked with the alkali soluble resin of the component (A), the compound of the component (B) is separated (de-crosslinked) from the alkali soluble resin of the component (A) due to an acid generated by exposure under the presence of a photoacid generator. Subsequently, the compound of the component (B) is removed with the alkali soluble resin of the component (A) by development using an alkaline developer. Therefore, for example, vinyl ether compounds typically used for the component of a vinyl ether-type chemically amplified resist can be applied as this type of compound.

Using such a compound has an advantage that adjusting the density of thermal crosslinking by varying a blending amount of the compound can control the shape of a film formed.

As the compounds of the component (B), compounds represented by Formula (3) and Formula (4) are particularly preferable among the vinyl ether compounds in terms of being developed with no residual film and residue at an exposed part.

[Chemical Formula 5]

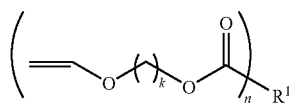

Formula (3)

(where n represents an integer of 2 to 10; k represents an integer of 1 to 10; and $R^1$ represents a n-valent organic group).

[Chemical Formula 6]

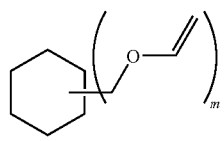

Formula (4)

(where m represents an integer of 2 to 10).

n in Formula (3) represents the number of vinyl ether groups in one molecule. n is more preferably an integer of 2 to 4. m in Formula (4) also represents the number of vinyl ether groups in one molecule. m is more preferably an integer of 2 to 4.

Specific examples of the compounds represented by Formula (3) and Formula (4) include bis(4-(vinyloxymethyl)cyclohexylmethyl)glutarate, tri(ethylene glycol)divinyl ether, adipic acid divinyl ester, diethylene glycol divinyl ether, tris(4-vinyloxy)butyltrimellitate, bis(4-(vinyloxy)butyl)terephthalate, bis(4-(vinyloxy)butyl)isophthalate, and cyclohexanedimethanoldivinylether.

The compound of the component (B) is used in a ratio of 1 to 80 parts by mass, preferably 5 to 40 parts by mass based on 100 parts by mass of the alkali soluble resin of the component (A). When the amount of the compound of the component (B) to be used is too small an amount that is less than the lower limit of the above range, since a film thickness loss at an unexposed part is pronounced, the relief shape of a pattern becomes defective. On the other hand, when the amount of the compound of the component (B) to be used is too large an amount that is more than the upper limit of the above range, since the sensitivity of the film is lowered significantly, the residue between patterns remains after development.

(Component (C))

The component (C) is a compound having two or more blocked isocyanate groups in one molecule thereof. The type and the structure of the compound are not particularly limited as long as the compound has, in one molecule thereof, two or more blocked isocyanate groups that can thermally cure a film, which is made of the alkali soluble resin of the component (A) that is thermally crosslinked with the compound of the component (B) or further decrosslinked from the compound of the component (B), at a postbaking temperature in common use.

The compound of the component (C) has, in one molecule thereof, two or more blocked isocyanate groups in which an isocyanate group (—NCO) is blocked with a proper protecting group. When the compound is exposed to high temperature during thermal curing, the protecting group (blocking part) is removed by thermal dissociation. Subsequently, a crosslinking reaction is progressed between functional groups for thermal curing in the alkali soluble resin of the component (A) (for example, a hydroxy group other than a phenolic hydroxy group and an amino group having active hydrogen) via a generated isocyanate group. Examples of the compound include a compound having two or more groups represented by Formula (5):

[Chemical Formula 7]

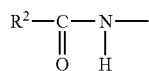

Formula (5)

(where $R^2$ represents an organic group of a blocking part) (these groups may be the same as or different from each other) in one molecule thereof.

The compound of the component (C) having two or more blocked isocyanate groups in one molecule thereof can be obtained by, for example, making a proper blocking agent act on a compound having two or more isocyanate groups in one molecule thereof.

Examples of the compound having two or more isocyanate groups in one molecule thereof include: isophorone diisocyanate, 1,6-hexamethylenediisocyanate, methylene bis(4-cyclohexyl isocyanate), and trimethylhexamethylenediisocyanate; or a dimer and a trimer thereof; or a reactant of these compounds and diols, triols, diamines, and triamines.

Examples of the blocking agent include: alcohols such as methanol, ethanol, isopropanol, n-butanol, 2-ethoxyhexanol, 2-N,N-dimethylaminoethanol, 2-ethoxyethanol, and cyclohexanol; phenols such as phenol, o-nitrophenol, p-chlorophenol, and o-, m-, or p-cresol; lactams such as 6-caprolactam; oximes such as acetone oxime, methyl ethyl ketone oxime, methyl isobutyl ketone oxime, cyclohexanone oxime, acetophenone oxime, and benzophenone oxime; pyrazoles such as pyrazole, 3,5-dimethylpyrazole, and 3-methylpyrazole; and thiols such as dodecanethiol and benzenethiol.

In the compound of the component (C), at a higher temperature such as a postbaking temperature, thermal dissociation of a blocking part is caused to progress a crosslinking reaction via isocyanate groups. However, at a lower temperature such as a prebaking temperature, so as not to progress crosslinking with isocyanate groups, the compound of the component (C) having a temperature of thermal dissociation of the blocking part that is considerably higher than the prebaking temperature, for example, having a temperature of 120° C. to 230° C., is particularly preferred.

Specific examples of the component (C) include as follows:

[Chemical Formula 8]

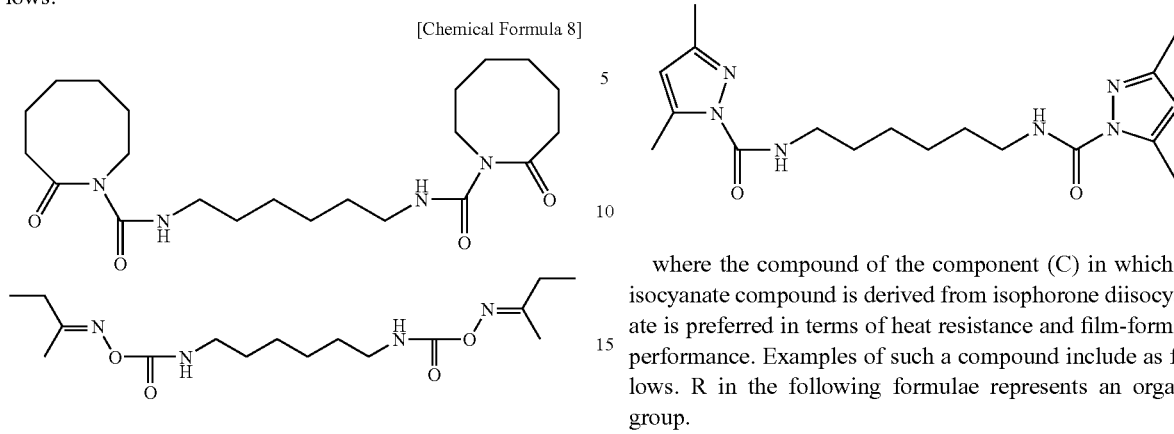

where the compound of the component (C) in which an isocyanate compound is derived from isophorone diisocyanate is preferred in terms of heat resistance and film-forming performance. Examples of such a compound include as follows. R in the following formulae represents an organic group.

[Chemical Formula 9]

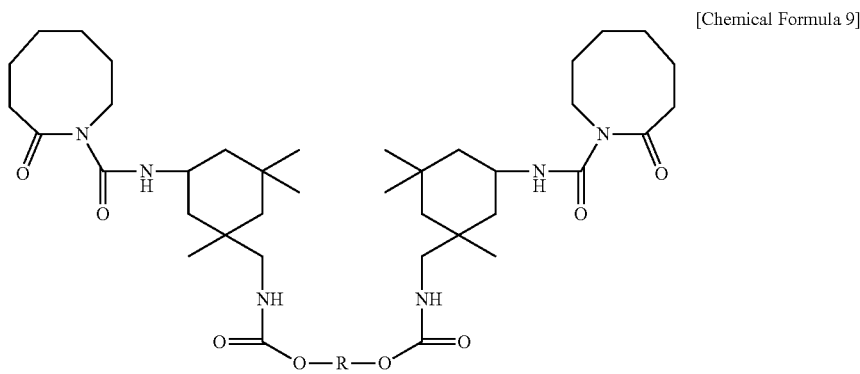

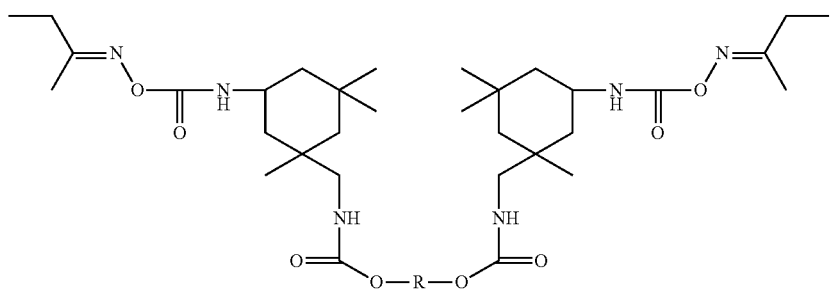

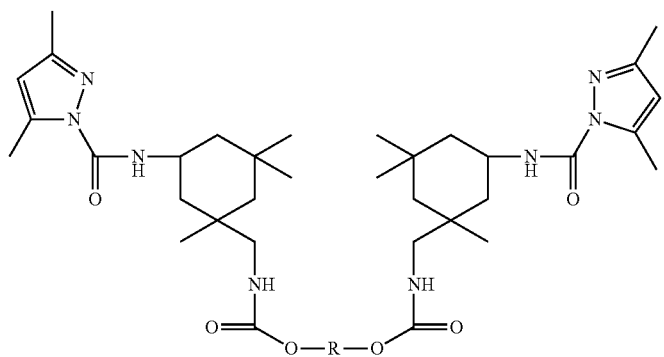

[Chemical Formula 10]
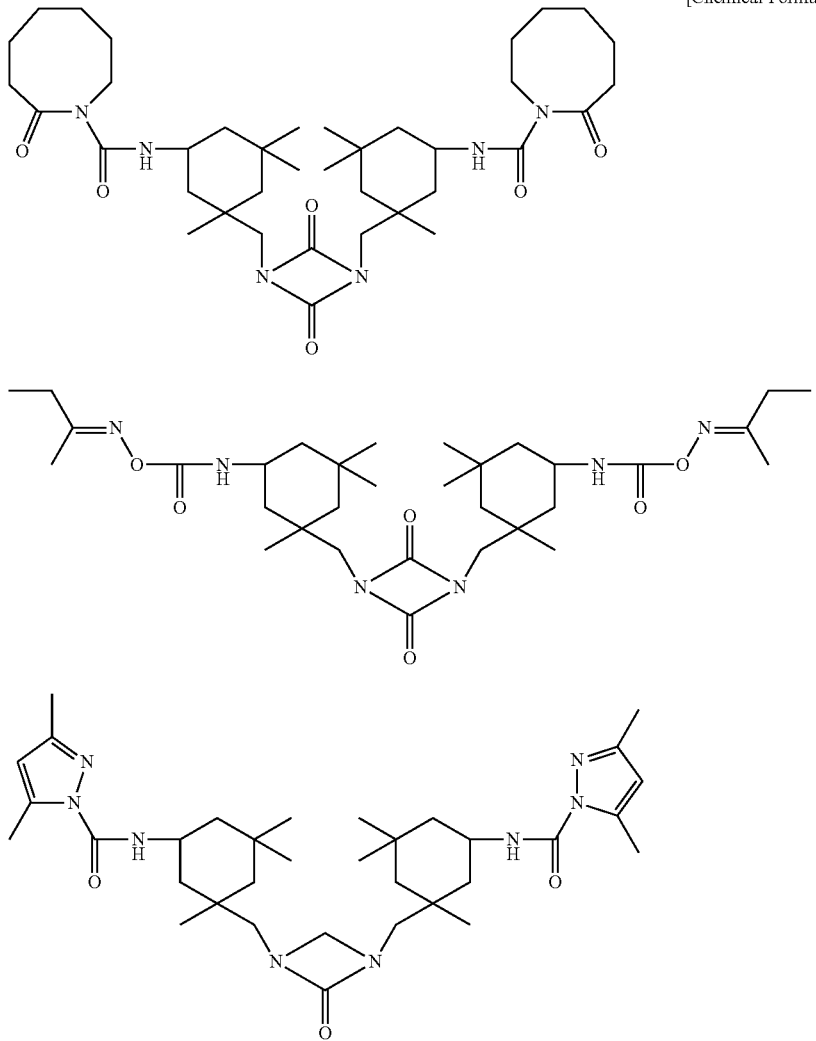
[Chemical Formula 11]
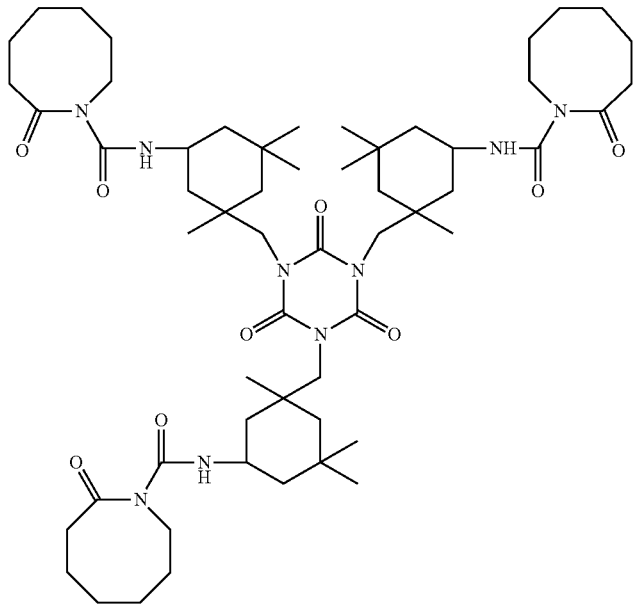

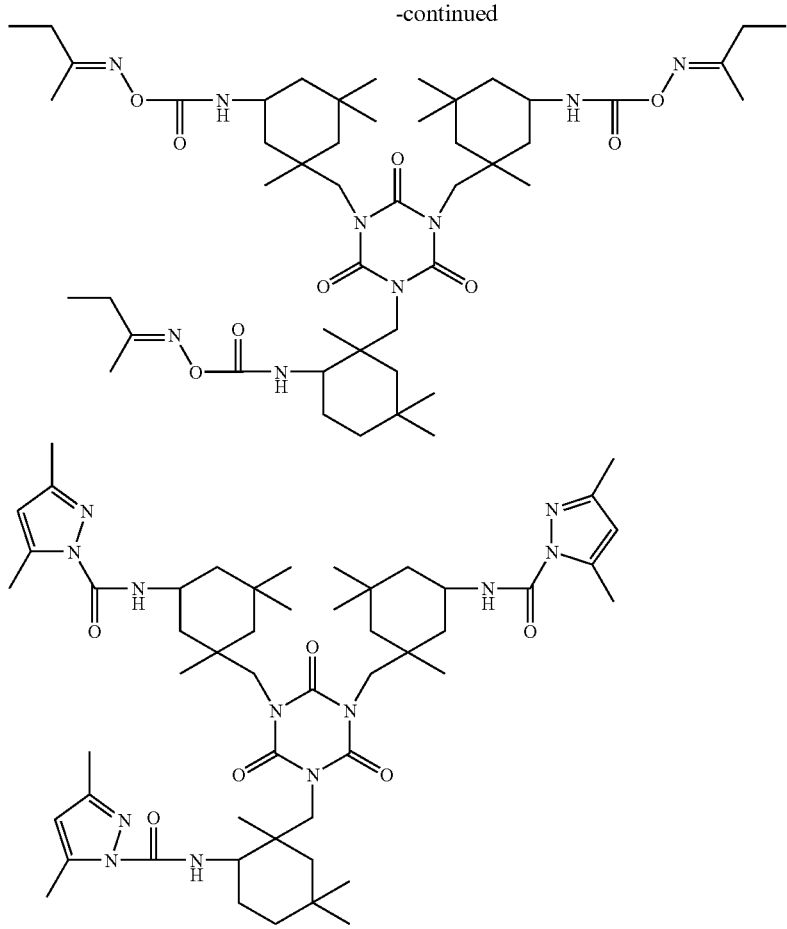

In the present invention, the compound of the component (C) may be used singly or in combination of two or more thereof.

In addition, the compound of the component (C) is used in a ratio of 1 to 80 parts by mass, preferably 5 to 40 parts by mass based on 100 parts by mass of the alkali soluble resin of the component (A). When the amount of the compound of the component (C) to be used is too small an amount that is less than the lower limit of the above range, since thermal curing is inadequate, a sufficient cured film cannot be obtained. On the other hand, when the amount of the compound of the component (C) to be used is too large an amount that is more than the upper limit of the above range, since development is inadequate, development residue occurs.

(Component (D))

The component (D) is a photoacid generator (PAG). The component is a substance that generates an acid (sulfonic acids, calboxylic acids, or the like) directly or indirectly by being irradiated with light used for exposure. The type, the structure, and the like of the component are not particularly limited so long as the component has such characteristics.

Examples of the photoacid generator of the component (D) include diazomethane compounds, onium salt compounds, sulfonimide compounds, disulfone type compounds, sulfonic acid derivative compounds, nitrobenzyl compounds, benzoin tosylate compounds, iron arene complexes, halogen-containing triazine compounds, acetophenone derivative compounds, and cyano group-containing oxime sulfonate compounds. Any of the photoacid generator known in related art or used in related art is not particularly limited and can be applied to the present invention. In addition, in the present invention, the photoacid generator of the component (D) may be used singly or in combination of two or more thereof.

Specific examples of the photoacid generator include as follows. However, these compounds are examples among a number of applicable photoacid generators, and the compounds are obviously not limited thereto.

[Chemical Formula 12]

Formula (6)

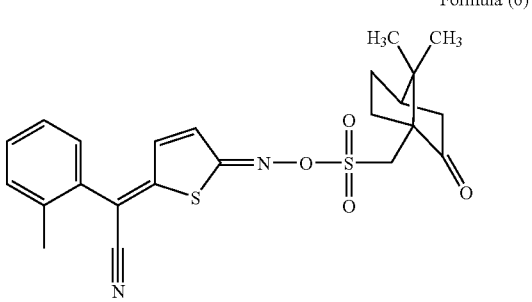

Formula (7)

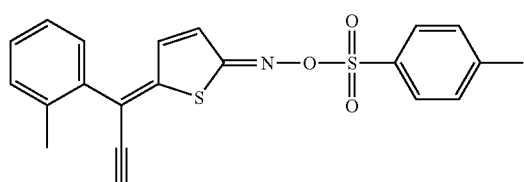

Formula (8)

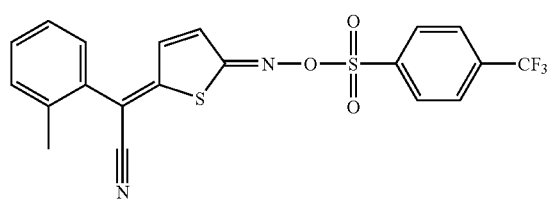

Formula (9)

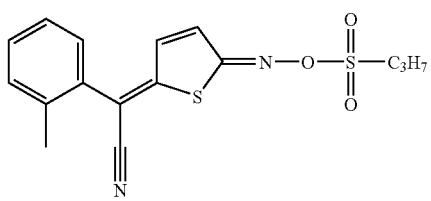

Formula (10)

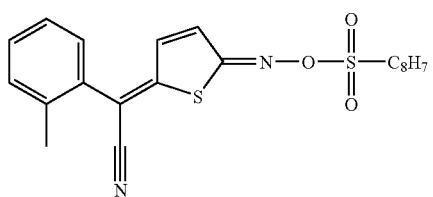

diphenyliodonium chloride, diphenyliodonium trifluoromethanesulfonate, diphenyliodonium mesylate, diphenyliodonium tosylate, diphenyliodonium bromide, diphenyliodonium tetrafluoroborate, diphenyliodonium hexafluoroantimonate, diphenyliodonium hexafluoroarsenate, bis(p-tert-butylphenyl)iodoniumhexafluorophosphate, bis(p-tert-butylphenyl)iodonium mesylate, bis(p-tert-butylphenyl)iodonium tosylate, bis(p-tert-butylphenyl)iodonium trifluoromethanesulfonate, bis(p-tert-butylphenyl)iodonium tetrafluoroborate, bis(p-tert-butylphenyl)iodonium chloride, bis(p-chlorophenyl)iodonium chloride, bis(p-chlorophenyl)iodonium tetrafluoroborate, triphenylsulfonium chloride, triphenylsulfonium bromide, triphenylsulfonium trifluoromethanesulfonate, tri(p-methoxyphenyl)sulfonium tetrafluoroborate, tri(p-methoxyphenyl)sulfonium hexafluoro phosphonate, tri(p-ethoxyphenyl)sulfonium tetrafluoroborate, triphenylphosphonium chloride, triphenylphosphonium bromide, tri(p-methoxyphenyl)phosphonium tetrafluoroborate, tri(p-methoxyphenyl)phosphonium hexafluoro phosphonate, tri(p-ethoxyphenyl)phosphonium tetrafluoroborate,

[Chemical Formula 13]

Formula (11)

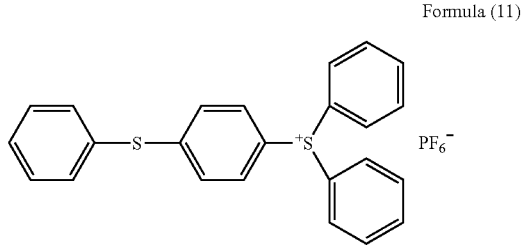

Formula (12)

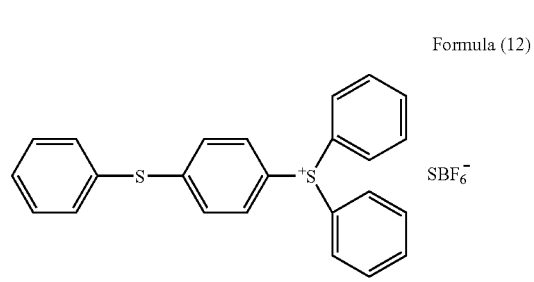

Formula (13)

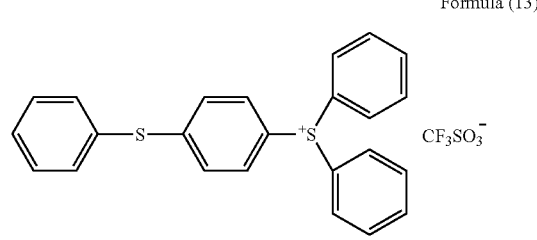

Formula (14)

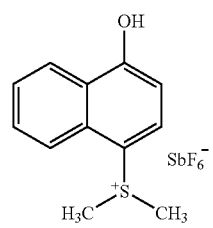

Formula (15)

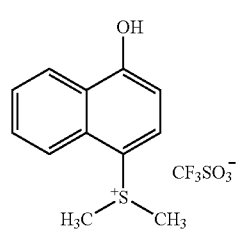

Formula (16)

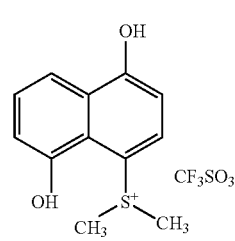

Formula (17)
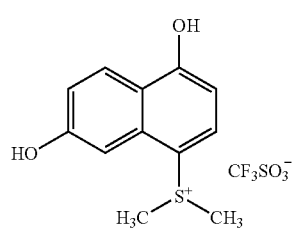
[Chemical Formula 14]
Formula (18)
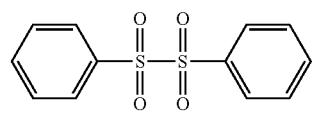
Formula (19)
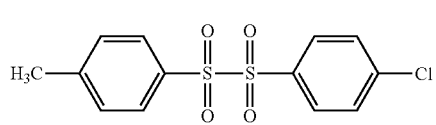
Formula (20)
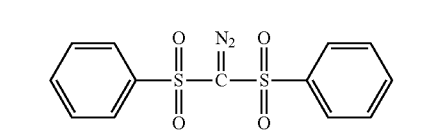
Formula (21)
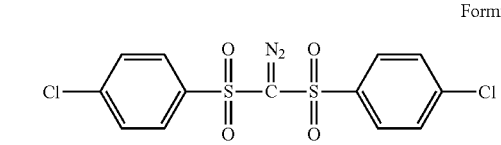
Formula (22)
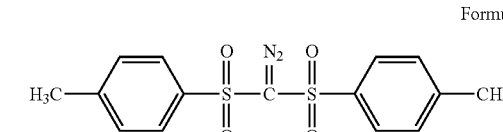
Formula (23)
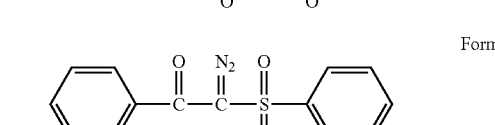
Formula (24)
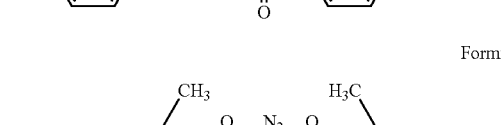
Formula (25)
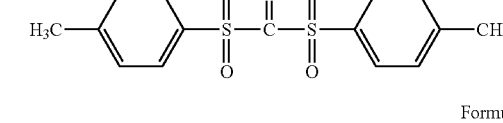
Formula (26)
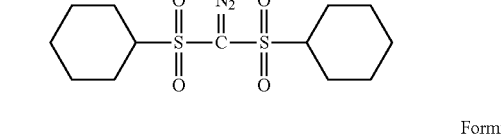
Formula (27)
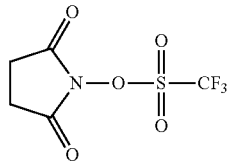
Formula (28)
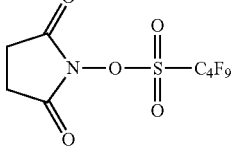
Formula (29)
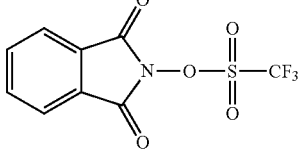
[Chemical Formula 15]
Formula (30)
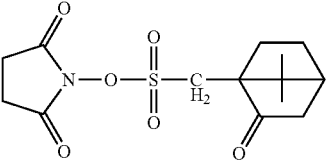
Formula (31)
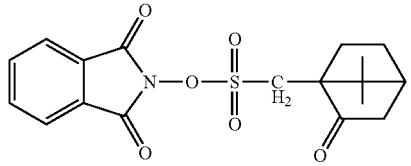
Formula (32)
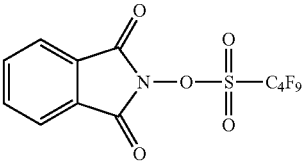
Formula (33)
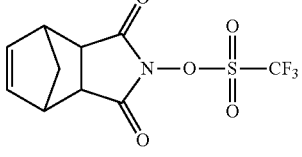
Formula (34)
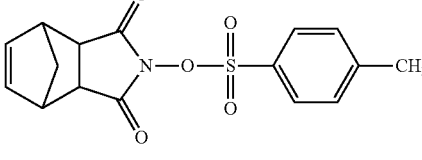
Formula (35)
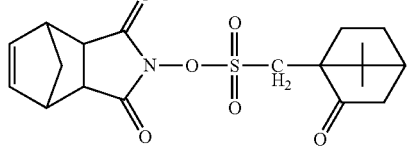

-continued
Formula (36)
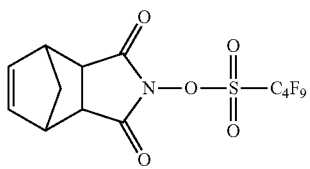
[Chemical Formula 16]
Formula (37)
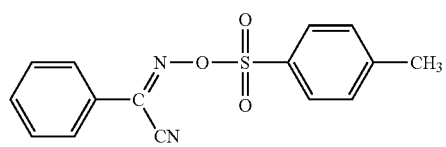
Formula (38)
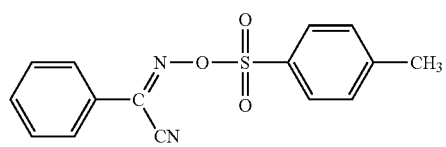
Formula (39)
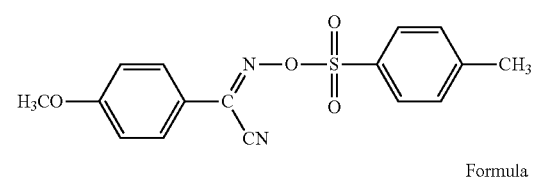
Formula (40)
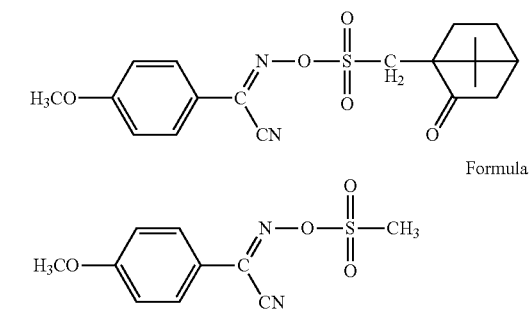
Formula (41)
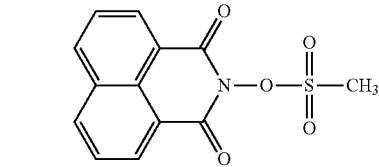
Formula (42)
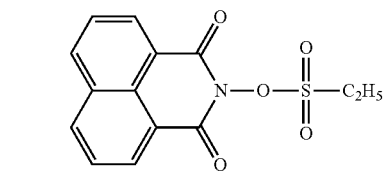
Formula (43)
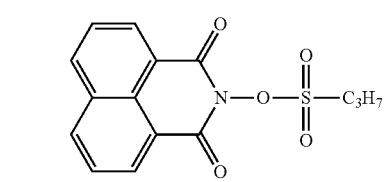
Formula (44)
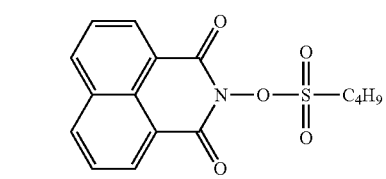
Formula (45)
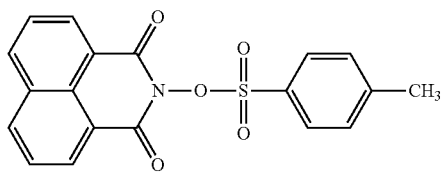
Formula (46)
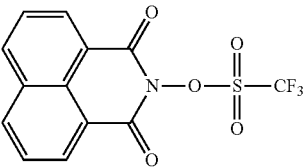
[Chemical Formula 17]
Formula (47)
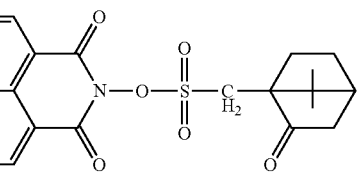
Formula (48)
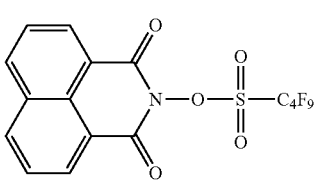
Formula (49)
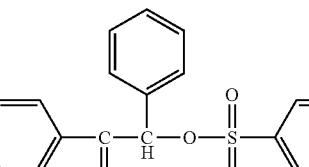
Formula (50)
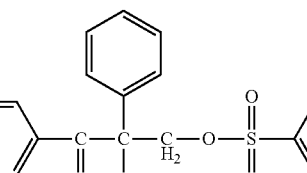
Formula (51)
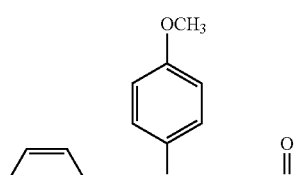

-continued

Formula (52)

Formula (53)

Formula (54)

Formula (55)

Formula (56)

Formula (57)

Formula (58)

Formula (59)

-continued

Formula (60)

Formula (61)

Formula (62)

Formula (63)

Formula (64)

[Chemical Formula 19]

Formula (65)

Formula (66)

Formula (67)

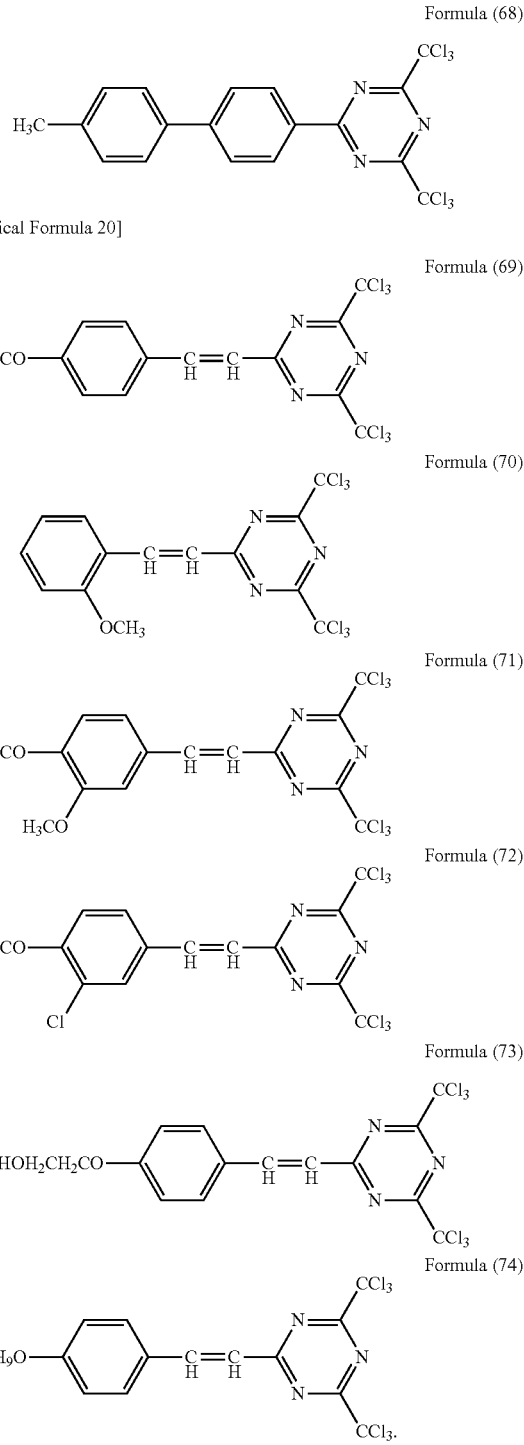

In addition, the photoacid generator of the component (D) is used in a ratio of 0.5 to 80 parts by mass, preferably 1 to 30 parts by mass based on 100 parts by mass of the alkali soluble resin of the component (A). When the amount of the photoacid generator of the component (D) to be used is too small an amount that is less than the lower limit of the above range, since dissociation of the compound of the thermally crosslinked component (B) from the alkali soluble resin of the component (A) progresses insufficiently during exposure, the desired relief of a pattern is hardly obtained. On the other hand, when the amount of the photoacid generator of the component (D) to be used is too large an amount that is more than the upper limit of the above range, preservation stability of the positive photosensitive resin composition is lowered.

(Solvent (E))

The positive photosensitive resin composition of the present invention contains the component (A), the component (B), the component (C), and the component (D), and is in a state in which the components are dissolved in the solvent (E).

Therefore, the solvent (E) used in the present invention dissolves the component (A) to the component (D), and dissolves the component (F) to component (I) mentioned below, or the like to be optionally added. The type, the structure, and the like of the solvent are not particularly limited so long as the solvent has such dissolving ability.

Examples of the solvent (E) include ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol, propylene glycol monomethyl ether, propylene glycol monomethyl ether acetate, propylene glycol propyl ether acetate, toluene, xylene, methyl ethyl ketone, cyclopentanone, cyclohexanone, 2-heptanone, γ-butyrolactone, 2-hydroxypropionic acid ethyl ester, 2-hydroxy-2-methylpropionic acid ethyl ester, ethoxyacetic acid ethyl ester, hydroxyacetic acid ethyl ester, 2-hydroxy-3-methylbutanoic acid methyl ester, 3-methoxypropionic acid methyl ester, 3-methoxypropionic acid ethyl ester, 3-ethoxypropionic acid ethyl ester, 3-ethoxypropionic acid methyl ester, pyruvic acid methyl ester, pyruvic acid ethyl ester, ethyl acetate, butyl acetate, ethyl lactate, butyl lactate, N,N-dimethylformamide, N,N-dimethylacetamide, and N-methylpyrrolidone.

These solvents may be used singly or in combination of two or more thereof.

Among these solvents (E), propylene glycol monomethyl ether, propylene glycol monomethyl ether acetate, 2-heptanone, propylene glycol propyl ether, propylene glycol propyl ether acetate, ethyl lactate, butyl lactate, and the like are more preferred in terms of having favorable film-forming performance and high safety. These solvents are typically used as solvents for photoresist materials.

(Component (F))

The component (F) is an alkali soluble resin other than the component (A). In more detail, the component (F) is an alkali soluble resin having two types of functional groups as shown below, which are described as the component (A), in the structure of the resin, and has a number average molecular weight of 2,000 to 30,000. Namely, the above mentioned two types of functional groups are a functional group capable of carrying out a thermal crosslinking reaction with the compound of the component (B), and a functional group for curing a film, capable of carrying out a thermal curing reaction with the compound of the component (C). These functional groups are similar to the functional groups exemplified as the component (A).

The component (F) can be used in order to adjust a development rate or to suppress defective development during development. Specifically, the component (F) is effective to eliminate delay of a development rate that is prone to occur when the component (A) is singly used as a resin component according to the present invention, and/or to suppress defective development during development.

Here, this resin component means all alkali soluble resins used in the present invention. In more detail, this resin component means the amount of the component (A) used in the case of using the component (A) singly, or the total amount of the component (A) and the component (F) in the case of using the component (A) in combination with the component (F).

The positive photosensitive resin composition of the present invention can contain an alkali soluble resin of the component (F) other than the component (A) unless it undermines the effects of the present invention. In this case, the amount of the compound of the component (F) to be used is, for example 0.1 to 900 parts by mass, or in some cases 50 to 800 parts by mass, or preferably 100 to 700 parts by mass based on 100 parts by mass of the component (A). When the amount of the component (F) to be used is too small an amount that is less than the lower limit of the above range, the component does not contribute to adjusting a development rate or to eliminating defective development during development. On the other hand, when the amount of the component (F) to be used is too large an amount that is more than the upper limit of the above range, UV-ozone resistance may be lowered.

A method for obtaining the component (F) is not particularly limited, however, a copolymer obtained by a method similar to the method for obtaining the specific polymer of the component (A) is preferred.

For example, the component (F) is obtained by carrying out a polymerization reaction of: at least one type of monomers accordingly selected from a group consisting of a monomer having at least one of a carboxyl group and a phenolic hydroxy group; at least one type of monomers accordingly selected from a group consisting of a monomer having at least one of a hydroxy group other than a phenolic hydroxy group and an amino group having active hydrogen; optionally a monomer having no organic group having a fluoroalkyl group or a silicon atom other than the above monomer; and optionally a polymerization initiator or the like, in a solvent at a temperature of 50 to 110° C. At this time, the solvent used is not particularly limited so long as the solvent dissolves a monomer constituting the specific copolymer and the specific copolymer. Specific examples of the solvent include the solvents described as the solvent (E).

(Component (G))

In the present invention, a siloxane compound having a number average molecular weight of 100 to 2,000 may be used as the component (G). Here, this siloxane compound means an organosiloxane compound, a compound in which a part of the organosiloxane compound is replaced with a hydrogen atom or a hydroxy group, and a modified matter thereof.

The siloxane compound of the component (G) preferably has a characteristic that exudes on the surface of a pattern in a successive heat treatment process performed in a process for forming a cured film (an image forming film) from the positive photosensitive resin composition of the present invention, that is, in a heat treatment for a closslinking reaction of the component (A) and the component (B); a heat treatment after exposure; and a heat treatment for a closslinking reaction with the component (C).

The siloxane compound of the component (G) is preferably a compound having compatibility with each component in a solution of the positive photosensitive resin composition of the present invention, specifically having favorable compatibility with an alkali soluble copolymer of the component (A), and having favorable stability of the solution of the positive photosensitive resin composition. Further, the siloxane compound is preferably a compound having a number average molecular weight of 100 to 2,000 in terms of imparting solubility to a developer, and water repellency to the upper surface part of a remained pattern that is an unexposed area (a light shielded part).

Examples of such a siloxane compound include a liner siloxane compound, a siloxane compound having a branched structure, a cyclic siloxane compound, and a copolymer thereof. In addition, examples of these siloxane compounds can include: a siloxane compound modified with an unreactive group, such as an alkoxy-modified, polyether-modified, fluorine-modified, methylstyryl-modified, higher fatty acid ester-modified, hydrophilic special modified, or higher alkoxy modified siloxane compound; and a siloxane compound modified with a reactive group, such as an amino-modified, epoxy-modified, carboxy-modified, carbinol-modified, methacryl-modified, mercapto-modified, or phenol-modified siloxane compound.

Specific examples of these siloxane compounds include: liner siloxane such as polydimethylsiloxane, polymethylethylsiloxane, polymethylphenylsiloxane, polymethylhydrosiloxane, polymethylpropylsiloxane, polydiphenylsiloxane, and polymethylbutylsiloxane, or a copolymer thereof, cyclic siloxane such as cyclic polydimethylsiloxane, cyclic polymethylphenylsiloxane, cyclic polymethylhydrosiloxane, cyclic polymethylethylsiloxane, cyclic polymethylpropylsiloxane, and cyclic polymethylbutylsiloxane; a siloxane modified with an unreactive group, such as alkoxy-modified, polyether-modified, fluorine-modified, methylstyryl-modified, higher fatty acid ester-modified, hydrophilic special modified, or higher alkoxy modified siloxane; and a siloxane modified with a reactive group, such as amino-modified, epoxy-modified, carboxy-modified, carbinol-modified, methacryl-modified, mercapto-modified, or phenol-modified siloxane; and a copolymer thereof.

Among the siloxane compounds, polydimethylsiloxane, alkoxy-modified polydimethylsiloxane, polyether-modified polydimethylsiloxane, hydrophilic special modified polydimethylsiloxane, and carbinol-modified polydimethylsiloxane are preferred.

The siloxane compounds are commercially available. Specific examples of the siloxane compounds include: a liner siloxane compound of L-45 (manufactured by Nippon Unicar Company Limited), SH200, 510, 550, 710, 705, and 1107 (manufactured by Dow Corning Toray Co., Ltd.), X-22-162C, 3701E, 3710, 1821, 164S, 170DX, 176DX, 164A, and 4952, KF96, 50, 54, 99, 351, 618, 910, 700, 6001, 6002, and 8010, KR271, and 282 (manufactured by Shin-Etsu Chemical Co., Ltd), or the like; a cyclic siloxane compound of VS-7158 (manufactured by Nippon Unicar Company Limited), BY11-003 (manufactured by Dow Corning Toray Co., Ltd.), or the like; a modified siloxane compound of L-77, 720, 7001, and 7604, Y-7006, L-9300, FZ-2101, 2110, 2130, 2161, 3704, 3711, 3722, 3703, 3720, 3736, 3705, and 3760 (manufactured by Nippon Unicar Company Limited), SF8427, 8428, 8413, and 8417, SH193, 194, 190, 192, 556, 3746, 3749, 3771, and 8400, SRX280A, BY16-036, -848, -828, -853B, -855B, -839, -845, -752, -750, -838, and -150B, BX16-854, and -866, SF8421EG, SH28PA, SH30PA, ST89PA, and ST103PA (manufactured by Dow Corning Toray Co., Ltd.), ES1001N, and 1023, X-22-161, -163, -169, -162, and -164, KF-860, -101, -102, -6001, -6011, -6015, -8001, -351, -412, -910, and -905 (manufactured by Shin-Etsu Chemical Co., Ltd), or the like; a fluorine-modified siloxane compound of FS 1265 (manufactured by Dow Corning Toray Co., Ltd.), X-22-820, and FL100 (manufactured by Shin-Etsu Chemical Co., Ltd), or the like; and a copolymer of polysiloxane and polyalkylene oxide of FZ-2203, 2207, and 2222 (manufactured by Nippon Unicar Company Limited), or the like.

Among such siloxane compounds, a siloxane compound having a repeating unit of a structure represented by Formula (75) is specifically preferred.

[Chemical Formula 21]

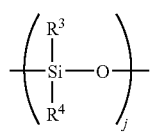

Formula (75)

(where each of $R^3$ and $R^4$ independently represents a hydrogen atom, an alkyl group, or a phenyl group; j represents a positive integer).

In the present invention, the siloxane compound may be any of modified or unmodified so long as the siloxane compound has a repeating unit of a structure represented by Formula (75).

In addition, when the siloxane compound has an epoxy group, since an acid component generated from a photoacid generator of the component (D) may be reacted with the epoxy group during exposure, a siloxane compound having no epoxy group is preferred.

Examples of the siloxane compound having no epoxy group include an unmodified siloxane compound; a siloxane compound modified with an unreactive group, such as an alkoxy-modified, polyether-modified, fluorine-modified, methylstyryl-modified, higher fatty acid ester-modified, hydrophilic special modified, or higher alkoxy modified siloxane compound; and a siloxane compound modified with a reactive group, such as an amino-modified, carboxy-modified, carbinol-modified, methacryl-modified, mercapto-modified, or phenol-modified siloxane compound.

Among these siloxane compounds, an unmodified siloxane compound and a carbinol-modified siloxane compound are more preferred.

The siloxane compound of the component (G) is used in a ratio of preferably 0.1 to 30 parts by mass, more preferably 1 to 20 parts by mass, particularly preferably 3 to 15 parts by mass based on 100 parts by mass of the alkali soluble copolymer of the component (A). When the amount of the compound of the component (G) to be used is an amount that is less than the lower limit of the above range, the compound does not contribute to improving water repellency of the surface of a pattern. On the other hand, when the amount of the compound of the component (G) to be used is an amount that is more than the upper limit of the above range, whitening and film unevenness may be caused when forming a coating film.

(Component (H))

The component (H) is an amine compound. The positive photosensitive resin composition of the present invention can further include an amine compound in order to improve preservation stability of the composition unless the compound undermines the effects of the present invention.

Although the amine compound of the component (H) is not particularly limited, examples thereof include a tertiary amine such as triethanolamine, tributanolamine, triisopropanolamine, trimethylamine, triethylamine, tri-n-propylamine, triisopropylamine, tri-n-butylamine, tri-tert-butylamine, trioctylaamine, triphenylamine, and diazabicyclooctane; and an aromatic amine such as pyridine and 4-dimethylaminopyridine; and further include a primary amine such as benzylamine and n-butylamine; and a secondary amine such as diethylamine and di-n-butylamine.

The amine compound of the component (H) may be used singly or in combination of two or more thereof.

When the amine compound of the component (H) is used, the content thereof is, for example 0.001 to 5 parts by mass, or in some cases 0.005 to 1 part by mass, or preferably 0.01 to 0.5 parts by mass based on 100 parts by mass of the alkali soluble resin of the component (A). When the amount of the amine compound of the component (H) to be used is too small an amount that is less than the lower limit of the above range, preservation stability of the positive photosensitive resin composition cannot be enhanced sufficiently. On the other hand, when the amount of the amine compound of the component (H) to be used is too large an amount that is more than the upper limit of the above range, sensitivity of the positive photosensitive resin composition may be lowered.

(Component (I))

The component (I) is a surfactant. The positive photosensitive resin composition of the present invention can further contain a surfactant in order to improve coating properties of the composition unless the surfactant undermines the effects of the present invention.

Although the surfactant of the component (I) is not particularly limited, examples thereof include a fluorinated surfactant, a silicone-based surfactant and a nonionic surfactant. For this type of surfactant, for example, a commercialized product manufactured by Sumitomo 3M Limited, DIC Corporation, Asahi Glass Co., Ltd., or the like can be used. These commercialized products are useful because of their easy availability. Specific examples of the surfactant include a fluorinated surfactant such as EFTOP EF301, EF303, and EF352 (manufactured by Mitsubishi Materials Electronic Chemicals Co., Ltd.), MEGAFAC F171, and F173 (manufactured by DIC Corporation), Fluorad FC 430, and FC431 (manufactured by Sumitomo 3M Limited), and Asahi Guard AG 710, Surflon S-382, SC 101, SC 102, SC 103, SC 104, SC 105, and SC 106 (manufactured by Asahi Glass Co., Ltd.).

The surfactant of the component (I) may be used singly or in combination of two or more thereof.

When the surfactant is used, the content thereof is generally 0.2% by mass or less, and preferably 0.1% by mass or less based on 100% by mass of the positive photosensitive resin composition. If the amount of the surfactant of the component (I) to be used is set at an amount over 0.2% by mass, the effect for improving the coating properties is lowered to be uneconomical.

(Other Additives)

Furthermore, the positive photosensitive resin composition of the present invention can contain, as necessary, an adhesion assistant such as a rheology modifier and a silane coupling agent, a pigment, a dye, a storage stabilizer, an antifoaming agent, or a dissolution promoter of polyhydric phenol, polycarboxylic acids, or the like, unless the additives undermine the effects of the present invention.

(Positive Photosensitive Resin Composition)

The positive photosensitive resin composition of the present invention contains an alkali soluble resin of the component (A), a compound having vinyl ether groups of the component (B), a compound having blocked isocyanate groups of the component (C), a photoacid generator of the component (D), and the solvent (E). In addition, the composition can further optionally contain one or more types of an alkali soluble resin of the component (F) other than the component (A), a siloxane compound of the component (G), an amine compound of the component (H), a surfactant of the component (I), and other additives.

Especially, preferable examples of the positive photosensitive resin composition of the present invention are as follows.

[1]: A positive photosensitive resin composition containing 1 to 80 parts by mass of the component (B), 1 to 80 parts by mass of the component (C), and 0.5 to 80 parts by mass of the component (D) based on 100 parts by mass of the component (A), in which these components are dissolved in the solvent (E).

[2]: According to the composition of [1], the positive photosensitive resin composition further containing 0.1 to 900 parts by mass of the component (F) based on 100 parts by mass of the component (A).

[3]: According to the composition of [1] or [2], the positive photosensitive resin composition further containing 0.1 to 30 parts by mass of the component (G) based on 100 parts by mass of the component (A).

[4]: According to the composition of [1], [2], or [3], the positive photosensitive resin composition further containing 0.001 to 5 parts by mass of the component (H) based on 100 parts by mass of the component (A).

[5]: The positive photosensitive resin composition further containing 0.2% by mass or less of the component (I) in the positive photosensitive resin composition of [1], [2], [3], or [4].

The ratio of a solid content in the positive photosensitive resin composition of the present invention is not particularly limited so long as each component is uniformly dissolved in a solvent. However, the ratio is, for example 1 to 80% by mass, or for example 5 to 60% by mass, or 10 to 50% by mass. Here, a solid content means components in which the solvent (E) is removed from all components of the positive photosensitive resin composition.

A method of preparing the positive photosensitive resin composition of the present invention is not particularly limited. However, examples of the method of preparing the composition include: a method of preparing a uniform solution by dissolving the component (A) (an alkali soluble resin) in the solvent (E), and by mixing this solution with the component (B) (a compound having two or more vinyl ether groups in one molecule thereof), the component (C) (a compound having two or more blocked isocyanate groups in one molecule thereof), and the component (D) (a photoacid generator) in a predetermined ratio; or a method of further adding, as necessary, at least one type selected from a group consisting of the component (F) (an alkali soluble resin other than the component (A)), the component (G) (a siloxane compound), the component (H) (an amine compound), the component (I) (a surfactant), and the other additives, in an appropriate step of this preparation method.

In the preparation of the positive photosensitive resin composition of the present invention, the solution of a specific copolymer obtained by a polymerization reaction in the solvent (E) can be used as is. In this case, when preparing a uniform solution by adding the component (B), the component (C), the component (D), and the like to this solution of the component (A) in a similar manner as the above, the solvent (E) may also be additionally charged in order to control a concentration. At this time, the solvent (E) used in a process of forming a specific copolymer, and the solvent (E) used to control a concentration when preparing the positive photosensitive resin composition may be the same as or different from each other.

Then, the solution of the prepared positive photosensitive resin composition is preferably used after being filtered using a filter having a pore diameter of approximately 0.2 μm, or the like.

(Coating Film and Cured Film)

A coating film can be formed as follows: applying the positive photosensitive resin composition of the present invention on a semiconductor substrate (for example, a silicon-silicon dioxide coated substrate, a silicon nitride substrate, a substrate coated with a metal such as aluminum, molybdenum, and chromium, a glass substrate, a quartz substrate, an ITO substrate) by spin coating, flow coating, roll coating, slit coating, spin coating following slit coating, inkjet coating, or the like; and thereafter predrying the coated substrate with a hot plate, an oven, or the like. Subsequently, a positive photosensitive resin film is formed by heat-treating this coating film.

As conditions of this heat-treating, for example, a heat temperature and a heat time appropriately selected from the ranges of a temperature of 70° C. to 160° C., and of a time of 0.3 to 60 minutes, are employed. The heat temperature and the heat time are preferably 80° C. to 140° C., and 0.5 to 10 minutes, respectively.

In addition, the film thickness of the positive photosensitive resin film formed from the positive photosensitive resin composition is, for example 0.1 to 30 μm, or for example 0.2 to 10 μm, or further, for example 0.2 to 5 μm.

Then, the formed positive photosensitive resin film becomes a film hardly-soluble in an alkaline developer through crosslinking a compound having vinyl ether groups of the component (B) with a resin of the component (A) by heat treatment when forming the film. In this case, when the temperature of the heat treatment is lower than the lower limit of the above temperature range, since thermal crosslinking becomes insufficient, a film thickness loss at an unexposed part thereof may occur. On the other hand, when the temperature of the heat treatment is much higher than the upper limit of the above temperature range, since a once formed thermal crosslinking part is cleaved again, a film thickness loss at an unexposed part thereof may occur.

When the positive photosensitive resin film formed from the positive photosensitive resin composition of the present invention is exposed to light such as an ultraviolet ray, ArF, KrF, or $F_2$ laser light using a mask having a predetermined pattern, an exposed part of the film becomes soluble in an alkaline developer by an action of an acid generated from a photoacid generator (PAG) of the component (D) contained in the positive photosensitive resin film.

Next, post exposure bake (PEB) is performed on the positive photosensitive resin film. As conditions of heating in this case, a heat temperature and a heat time appropriately selected from the ranges of a temperature of 80° C. to 150° C., and of a time of 0.3 to 60 minutes, are employed.

Subsequently, development is performed using an alkaline developer. In the positive photosensitive resin film, an exposed part is removed by the development to form the relief of a pattern.

Examples of the alkaline developer to be used include an alkaline aqueous solution, for example, an aqueous solution of alkali metal hydroxide such as potassium hydroxide and sodium hydroxide, an aqueous solution of quaternary ammonium hydroxide such as tetramethyl ammonium hydroxide, tetraethyl ammonium hydroxide, and choline, and an amine solution such as ethanolamine, propylamine, and ethylenediamine. Furthermore, a surfactant or the like can be added to these developers.

Among the above described alkaline developers, a 0.1 to 2.38% by mass aqueous solution of tetraethyl ammonium hydroxide is typically used as a developer for photoresists. The positive photosensitive resin composition of the present invention can also be successfully developed using this alkaline developer without causing problems such as swelling.

In addition, any of developing methods such as a liquid-piling method, a dipping method, and a dipping and shaking method can be used. A developing time in these methods is generally 15 to 180 seconds.

After the development, the patterned film is obtained by: washing the positive photosensitive resin film with running water for, for example, 20 to 90 seconds; and by air-drying the film by using compressed air or compressed nitrogen, or by spinning to remove a water content on the substrate.

Subsequently, a film having an advantageous relief pattern, excellent in heat resistance, transparency, a flattening property, a low water-absorbing property, chemical resistance, and the like is obtained by performing post bake to such a patterned film for thermal curing, specifically by heating the film by using a hot plate, an oven, or the like.

For the post bake, generally, a method of treating the film for 5 to 30 minutes in the case of on a hot plate, and for 30 to 90 minutes in the case of in an oven at a heat temperature selected from the range of a temperature of 140° C. to 250° C., is employed.

Then, a cured film having a favorable pattern shape can be obtained by such post bake.

A fine image having sufficiently high sensitivity, and having a considerably small film thickness loss during development at an unexposed part can be formed with the positive photosensitive resin composition of the present invention as above.

The characteristics of this cured film are high water repellency and high oil repellency on the surface of a film, which enable to suppress the reduction of water repellency and oil repellency after an oxygen plasma treatment (a UV ozone treatment).

Therefore, the positive photosensitive resin composition of the present invention is suitably used for a bank of fraction of pixels of an organic EL, or the like, or for an array flattening film for a TFT liquid crystal display device, various films for a liquid crystal or organic EL display, such as an interlayer insulating film, a protective film, and an insulating film, or the like.

EXAMPLES

The present invention will be further described in more detail referring to Examples, which should not be construed as limiting the scope of the present invention.

The meanings of the following abbreviations used in Examples are as follows.

MAA: methacrylic acid
MMA: methyl methacrylate
HEMA: 2-hydroxyethyl methacrylate
CHMI: N-cyclohexylmaleimide
PFMA: 2-(perfluorooctyl)ethyl methacrylate
TMSSMA: methacryloxypropyltris(trimethylsiloxy)silane
AIBN: azoisobutyronitrile
PGMEA: propylene glycol monomethyl ether acetate
PAG1: (2-methyl-α-(5-((propylsulfonyl)oxy)imino)-2-(5 H)-thienylidene)benzeneacetonitrile(oximesulfonate-based photoacid generator): (trade name) CGI1397; manufactured by Ciba Specialty Chemicals Inc.
PVE1: 1,4-cyclohexanedimethanol divinyl ether
NCO1: a compound represented by the following formula

[Chemical Formula 22]

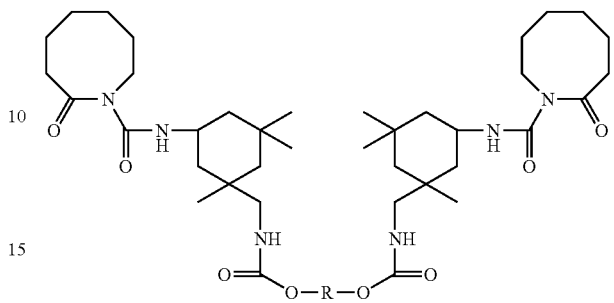

(trade name) B 1065; (registered trademark) VESTAGON; manufactured by Degussa AG
PDMS1: polydimethylsiloxane, polyether-modified, number average molecular weight (hereinafter referred to as Mn): 1,000

(Measurement of Number Average Molecular Weight and Weight Average Molecular Weight)

The number average molecular weight and the weight average molecular weight of a (specific) copolymer obtained according to Synthesis Examples are measured under a condition in which tetrahydrofuran of an eluting solvent was flowed in a column (a column temperature of 40° C.) at a flow rate of 1 ml/minute to elute the copolymer using a GPC device ((registered trademark) Shodex; column KF803L and KF804L) manufactured by JASCO Corporation. Here, the following number average molecular weight (hereinafter referred to as Mn) and weight average molecular weight (hereinafter referred to as Mw) were represented in converted molecular weights as polystyrene.

Synthesis Example 1

As monomer components constituting a specific copolymer, 12.5 g of MAA, 16.7 g of PFMA, 20.8 g of HEMA, and 48.9 g of TMSSMA were used. As an initiator of radical polymerization, 3.7 g of AIBN was used. The components and the initiator were subjected to a polymerization reaction in 307.8 g of PGMEA as a solvent at a temperature of 60° C. to 110° C. to obtain a solution of the component (A) (the specific copolymer) having Mn of 10,700 and Mw of 16,000 (the concentration of the specific copolymer: 25.0% by mass). (P1)

Synthesis Example 2

As monomer components constituting a copolymer, 15.5 g of MAA, 35.3 g of CHMI, 25.5 g of HEMA, and 23.7 g of MMA were used. As an initiator of radical polymerization, 5 g of AIBN was used. The components and the initiator were subjected to a polymerization reaction in 185 g of PGMEA as a solvent at a temperature of 60° C. to 100° C. to obtain a solution of the copolymer having Mn of 4,100 and Mw of 7,600 (the concentration of the copolymer: 35.0% by mass). (P2)

Synthesis Example 3

As monomer components constituting a copolymer, 7.5 g of MAA, 20.0 g of MMA, 10.0 g of HEMA, and 12.5 g of PFMA were used. As an initiator of radical polymerization, 1.59 g of AIBN was used. The components and the initiator were subjected to a polymerization reaction in 154.7 g of PGMEA as a solvent at a temperature of 60° C. to 100° C. to obtain a solution of the copolymer having Mn of 12,600 and Mw of 20,300 (the concentration of the copolymer: 25.0% by mass). (P3)

Synthesis Example 4

As monomer components constituting a copolymer, 3.0 g of MAA, 3.0 g of MMA, 4.0 g of HEMA, and 9.0 g of TMSSMA were used. As an initiator of radical polymerization, 0.96 g of AIBN was used. The components and the initiator were subjected to a polymerization reaction in 59.9 g of PGMEA as a solvent at a temperature of 60° C. to 100° C. to obtain a solution of the copolymer having Mn of 8,200 and Mw of 12,900 (the concentration of the copolymer: 25.0% by mass). (P4)

Examples 1 to 4 and Comparative Examples 1 to 5

According to compositions shown in Table 1, in the solution of the component (A), the component (B), the component (C), the component (D), and the solvent (E), and further a solution of the component (F) in the case of Examples 2 and 3 and Comparative Examples 1 to 3, and a solution of the component (F) and the component (G) in the case of Example 4 were mixed in predetermined ratios. Each mixture was stirred for 3 hours to be a uniform solution. As a result, positive photosensitive resin compositions of each Example and each Comparative Example were prepared.

a hot plate at a temperature of 110° C. for 120 seconds. Subsequently, development was performed by dipping the film in a 0.4% by mass tetramethylammonium hydroxide (hereinafter, referred to as TMAH) aqueous solution for 60 seconds, and then the film was washed under running water using ultrapure water for 20 seconds. The lowest exposure dose (mJ/cm$^2$) which causes no undissolved residue at an exposed part was designated as sensitivity.
(Evaluation of Film Thickness Loss)

The positive photosensitive resin composition was applied on a silicon wafer using a spin coater, and then the coated composition was pre-baked on a hot plate at a temperature of 110° C. for 120 seconds to form a coating film having a film thickness of 2.5 μm. This film was dipped in a 0.4% by mass TMAH aqueous solution for 60 seconds, and then the film was washed under running water using ultrapure water for 20 seconds. Next, the degree of a film thickness loss caused by development at an unexposed part was evaluated by measuring the thickness of this film. The film thickness obtained by this evaluation was measured using an F20 manufactured by Filmetrics Inc.
(Evaluation of Contact Angle)

The positive photosensitive resin composition was applied on a quartz substrate using a spin coater, and then the coated composition was pre-baked on a hot plate at a temperature of 110° C. for 120 seconds to form a coating film having a film thickness of 2.5 μm. This coating film was heated at a temperature of 230° C. for 30 minutes to perform post bake. As a result, a cured film having a film thickness of 1.9 μm was formed. The contact angles of water and dodecylbenzene (DB) on this cured film were measured using a Drop Master manufactured by Kyowa Interface Science Co., Ltd.

TABLE 1

|  | Solution of Component (A) (g) | Component (B) (g) | Component (C) (g) | Component (D) (g) | Solvent (E) (g) | Solution of Component (F) (g) | Component (G) (g) |
| --- | --- | --- | --- | --- | --- | --- | --- |
| Example 1 | P1 16.3 | PVE1 0.62 | NCO1 0.41 | PAG1 0.21 | PGMEA 0.22 | — | — |
| Example 2 | P1 8.2 | PVE1 0.62 | NCO1 0.41 | PAG1 0.21 | PGMEA 2.54 | P2 5.9 | — |
| Example 3 | P1 4.9 | PVE1 0.62 | NCO1 0.41 | PAG1 0.21 | PGMEA 3.64 | P2 8.1 | — |
| Example 4 | P1 8.2 | PVE1 0.62 | NCO1 0.41 | PAG1 0.21 | PGMEA 3.57 | P2 5.9 | PDMS1 0.31 |
| Comparative Example 1 | — | PVE1 0.62 | NCO1 0.41 | PAG1 0.21 | PGMEA 2.54 | P2/P3 5.9/8.2 | — |
| Comparative Example 2 | — | PVE1 0.62 | NCO1 0.41 | PAG1 0.21 | PGMEA 4.50 | P2 11.8 | — |
| Comparative Example 3 | — | PVE1 0.62 | NCO1 0.41 | PAG1 0.21 | PGMEA 2.54 | P2/P4 5.9/8.2 | — |

The evaluations of sensitivity, a film thickness loss (at an unexposed part), a contact angle, and resistance to oxygen plasma treatment were performed on each composition in Examples 1 to 4, and Comparative Examples 1 to 3.
(Evaluation of Sensitivity)

The positive photosensitive resin composition was applied on a silicon wafer using a spin coater, and then the coated composition was pre-baked on a hot plate at a temperature of 110° C. for 120 seconds to form a coating film having a film thickness of 2.5 μm. The film thickness was measured using an F20 manufactured by Filmetrics Inc. This coating film was irradiated with an ultraviolet ray having a light intensity of 5.5 mW/cm$^2$ at 365 nm for a certain time by using an ultraviolet irradiation device PLA-600FA manufactured by Canon Inc. Next, post exposure bake (PEB) was performed on the film on (Evaluation of Resistance to Oxygen Plasma (UV Ozone Washing) Treatment)

The positive photosensitive resin composition was applied on a quartz substrate using a spin coater, and then the coated composition was pre-baked on a hot plate at a temperature of 110° C. for 120 seconds to form a coating film having a film thickness of 2.5 μm. This coating film was heated at a temperature of 230° C. for 30 minutes to perform post bake. As a result, a cured film having a film thickness of 1.9 μm was formed. This coating film was washed with UV ozone using a UV-312 manufactured by Technovision, Inc. for 15 minutes. The contact angle of water on the film treated by UV ozone washing was measured in a manner similar to [Evaluation of contact angle].

Here, measurement results of contact angles on the cured film formed from the positive photosensitive resin composition in Example 1 before the UV ozone washing treatment and after the UV ozone treatment (5 minutes, 10 minutes, 15 minutes) were shown in FIG. 1 (water) and FIG. 2 (dodecylbenzene).

(Evaluation Results)

The results of the above evaluations will be shown in Table 2.

TABLE 2

| | Sensitivity | Film Thickness Loss* | Contact Angle (°) | | | |
|---|---|---|---|---|---|---|
| | | | After Post Bake | | After UV Ozone Washing Treatment | |
| | (mJ/cm$^2$) | (μm) | Water | DB | Water | DB |
| Example 1 | 30 | None | 104 | 49 | 97 | 48 |
| Example 2 | 27 | None | 103 | 48 | 95 | 48 |
| Example 3 | 25 | None | 100 | 45 | 93 | 43 |
| Example 4 | 27 | None | 103 | 46 | 96 | 49 |
| Comparative Example 1 | 27 | None | 102 | 51 | 15 | 25 |
| Comparative Example 2 | 27 | None | 72 | 28 | 30 | 13 |
| Comparative Example 3 | 30 | None | 95 | 35 | 75 | 35 |

*"None Film Thickness Loss" means a situation in which a film thickness loss was not observed as a result of the measurement (that is, there was no film thickness loss causing an actual problem).

In any of Examples 1 to 4, the films had high sensitivity and film thickness losses causing an actual problem at an unexposed part were not observed. Then, the reduction of high water repellency and oil repellency on the surface of the cured film was suppressed even after the UV ozone treatment, and resistance to oxygen plasma treatment was found to be high.

In addition, according to the measurement results of the contact angles on the cured film formed from the positive photosensitive resin composition in Example 1 before and after the UV ozone washing treatment, the reduction of a contact angle with time of the UV ozone washing treatment in both water (FIG. 1) and dodecylbenzene (FIG. 2) did not occur, which resulted in retaining high water repellency and oil repellency.

Comparative Example 1 showed high water repellency and oil repellency of the surface of the cured film, however, showed low resistance to the UV ozone washing treatment.

Comparative Example 2 showed low water repellency and oil repellency, and also showed low resistance to the UV ozone washing treatment.

Comparative Example 3 showed high water repellency, however, showed low oil repellency and resistance to the UV ozone washing treatment.

INDUSTRIAL APPLICABILITY

The positive photosensitive resin composition according to the present invention is suitable as a material for forming a cured film such as a protective film, a flattening film, and an insulating film for various displays such as a thin film transistor (TFT) liquid crystal display device and an organic EL device. Specifically, the positive photosensitive resin composition is suitable as a material for forming an interlayer insulating film, a protective film for a color filter, and an array flattening film of a TFT liquid crystal display, a concavoconvex film at the lower side of a reflective film of a reflective display, an insulating film of an organic EL display, or the like. The positive photosensitive resin composition is further suitable as various electric materials such as a microlens material.

Figure 1:
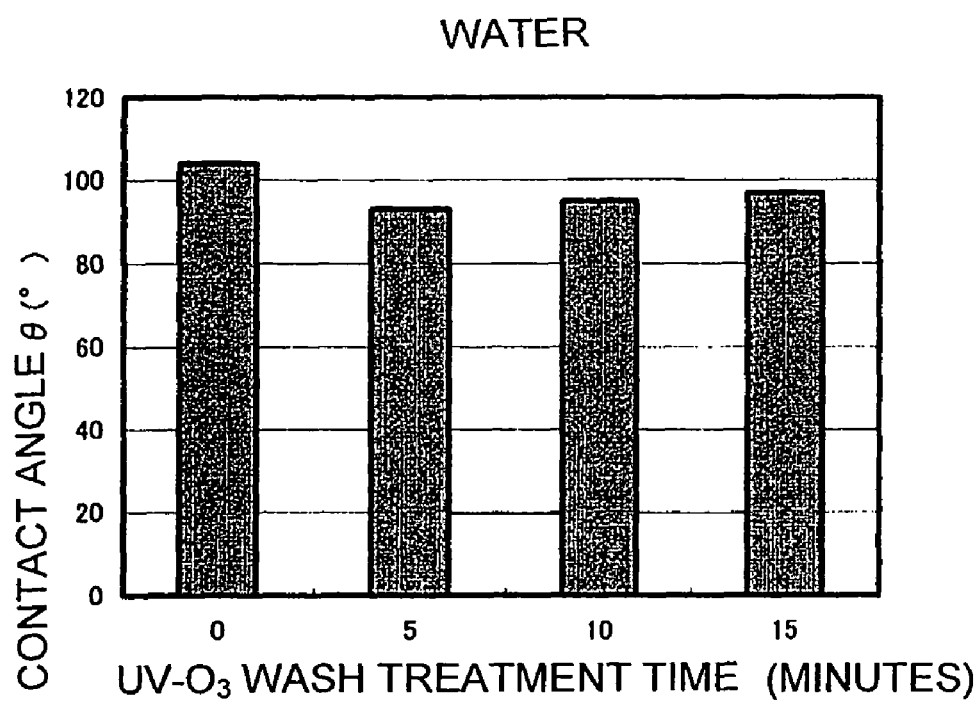
FIG. 1 is a view showing a contact angle θ(°) of water on the cured film formed from the positive photosensitive resin composition in Example 1 before and (5 minutes, 10 minutes, 15 minutes) after a UV ozone washing treatment.
Figure 2:
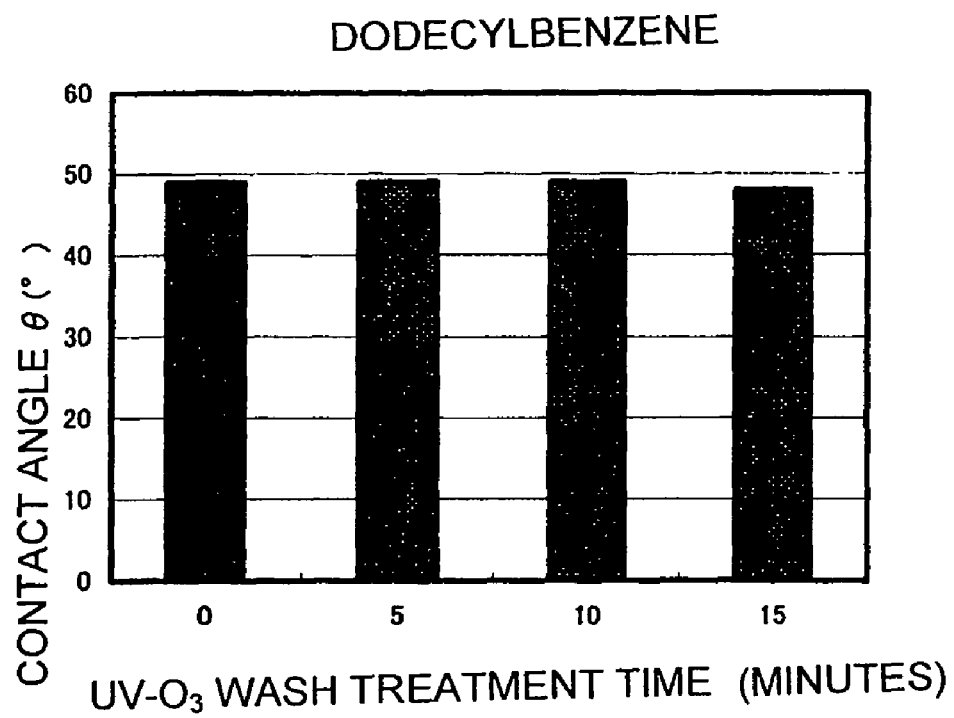
FIG. 2 is a view showing a contact angle θ(°) of dodecylbenzene on the cured film formed from the positive photosensitive resin composition in Example 1 before and (5 minutes, 10 minutes, 15 minutes) after a UV ozone washing treatment.

The invention claimed is:

1. A positive photosensitive resin composition comprising:
   a component (A);
   a component (B);
   a component (C);
   a component (D); and
   a solvent (E); wherein the component (A): is an alkali soluble resin having a functional group capable of carrying out a thermal crosslinking reaction with a compound of the component (B), a functional group for curing a film, capable of carrying out a thermal curing reaction with a compound of the component (C), an organic group having a fluoroalkyl group, and an organic group containing a silicon atom, and having a number average molecular weight of 2,000 to 30,000;
   the component (B): is a compound having two or more vinyl ether groups in one molecule thereof;
   the component (C): is a compound having two or more blocked isocyanate groups in one molecule thereof;
   the component (D): is a photoacid generator; and
   the solvent (E).

2. The positive photosensitive resin composition according to claim 1, wherein the functional group capable of carrying out a thermal crosslinking reaction is at least one type selected from a group consisting of a carboxyl group and a phenolic hydroxy group, and the functional group for curing a film is at least one type selected from a group consisting of a hydroxy group other than a phenolic hydroxy group and an amino group having active hydrogen.

3. The positive photosensitive resin composition according to claim 1, wherein the organic group having a fluoroalkyl group has a structure shown in Formula (1):

[Chemical Formula 1]

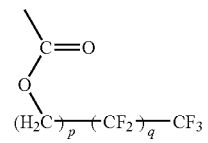

(where p represents an integer of 0 to 5; q represents an integer of 0 to 11).

4. The positive photosensitive resin composition according to claim 1, wherein the organic group containing a silicon atom has a structure shown in Formula (2):

[Chemical Formula 2]

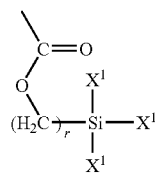

(2)

(where $X^1$ represents a methyl group, an ethyl group, a trimethoxysiloxy group, or a triethoxysiloxy group; r represents an integer of 0 to 5).

5. The positive photosensitive resin composition according to claim 1, wherein 1 to 80 parts by mass of the component (B), 1 to 80 parts by mass of the component (C), and 0.5 to 80 parts by mass of the component (D) are contained based on 100 parts by mass of the component (A).

6. The positive photosensitive resin composition according to claim 1, further comprising:
an alkali soluble resin other than the component (A) as a component (F); wherein
1 to 900 parts by mass of the alkali soluble resin other than the component (A) is contained based on 100 parts by mass of the component (A).

7. The positive photosensitive resin composition according to claim 5, further comprising:
a siloxane compound as a component (G); wherein
0.1 to 30 parts by mass of the siloxane compound is contained based on 100 parts by mass of the component (A).

8. A cured film made of the positive photosensitive resin composition as claimed in claim 1.

9. A barrier rib material for an organic electroluminescent (EL) display device comprising:
the cured film as claimed in claim 8.

10. A liquid crystal display device comprising:
the cured film as claimed in claim 8.

11. An array flattening film for a liquid crystal display comprising:
the cured film as claimed in claim 8.

12. An interlayer insulating film comprising:
the cured film as claimed in claim 8.

* * * * *